United States Patent
Yokoyama et al.

(10) Patent No.: US 6,461,957 B1
(45) Date of Patent: Oct. 8, 2002

(54) METHOD OF MANUFACTURING SEMICONDUCTOR DEVICE

(75) Inventors: Natsuki Yokoyama, Mitaka (JP); Masakazu Kawano, Mitaka (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/026,708

(22) Filed: Dec. 27, 2001

(30) Foreign Application Priority Data

Mar. 5, 2001 (JP) ........................................ 2001-059779

(51) Int. Cl.[7] .......................................... H01L 21/4763
(52) U.S. Cl. ....................... 438/622; 438/630; 438/648; 438/675; 438/680
(58) Field of Search ................................ 438/592, 620, 438/630, 675, 680, 622, 625, 629, 648, 649

(56) References Cited

U.S. PATENT DOCUMENTS

| | | | | |
|---|---|---|---|---|
| 5,563,097 A | * | 10/1996 | Lee | 438/620 |
| 5,595,936 A | * | 1/1997 | Choi et al. | 438/621 |
| 5,702,972 A | | 12/1997 | Tsai et al. | 438/305 |
| 5,741,721 A | * | 4/1998 | Stevens et al. | 438/396 |
| 5,834,367 A | * | 11/1998 | Otsuka et al. | 438/618 |
| 6,180,513 B1 | * | 1/2001 | Otsuka et al. | 438/630 |
| 6,271,125 B1 | * | 8/2001 | Yoo et al. | 438/637 |

FOREIGN PATENT DOCUMENTS

JP            6-112157          9/1992

OTHER PUBLICATIONS

K. Ohto, K. Urabe, T. Taguwa, S. Chikaki and T. Kikkawa, A novel TiN/Ti contact plug technology for gigabit scale DRAM using Ti–PECVD and TiN–LPCVS, International Electron Devices Meeting Technical Digest (Dec. 8–11, 1996), pp. 361–364.

* cited by examiner

Primary Examiner—T. N. Quach

(57) ABSTRACT

A layer comprising a second metal silicide as a major constituent element or a layer comprising a second metal as a major constituent element is formed simultaneously by one single chemical vapor deposition process to the bottom surface of two out of there groups of openings etched in a dielectric film on a substrate. A surface comprising silicon as a major constituent element is exposed at each bottom ("through holes or local interconnection holes") of the first group of openings, a surface comprising a first metal silicide as a major constituent element is exposed at each bottom of the second group of openings, and a surface comprising a first metal as a major constituent element is exposed at each bottom of the third group of openings. The manufacturing method provides low contact resistance and sufficiently small junction leakage current from a diffusion layer in connection with plugs or local interconnections, even if the etched area of the openings are of different depths, shapes, or sizes.

20 Claims, 19 Drawing Sheets

METHOD OF MANUFACTURING SEMICONDUCTOR DEVICE

BACKGROUND OF THE INVENTION

1. Field of the Invention

This invention concerns a semiconductor device and a method of manufacturing the same. In particular, it relates to a method of manufacturing a memory semiconductor device having a fine connection plug, a high performance logic semiconductor device having a fine connection plug or a local wiring. It also relates to a memory/logic embedded LSI having a memory circuit and a logic circuit together.

2. Description of Related Art

In semiconductor devices now under development for higher integration density, application of a conductive layer formed by stacking a low resistance material layer and a silicon layer such as a metal silicide layer/silicon layer or a metal layer/metal nitride layer/silicon layer instead of an existent single silicon layer has been started (layer constitution expressed by A/B means that A is an upper layer and B is a lower layer). This is because the stacked conductive layer is effective for the lowering of the sheet resistance of the conductive layer itself or reduction of contact resistance between the conductive layer and the interconnection layer disposed above it.

A first application example of the stacked conductive layer is source and drain areas of MOS (Metal Oxide Semiconductor) transistors. A structure of stacking to form a silicide layer of a metal such as titanium or cobalt on the entire surface of an impurity-doped diffusion layer comprising silicon instead of a diffusion layer of a silicon monolayer has been used for a logic semiconductor device such as in a high speed processor. Further, study has also been made on a nickel silicide layer. When the metal silicide layer is formed over the entire surface of the diffusion layer such that both the diffusion layer resistance and the contact resistance between the diffusion layer and the upper interconnection layer are reduced. There is another technique for forming a silicide layer of metal such as titanium, cobalt or nickel on polysilicon of a gate layer simultaneously with source and drain areas so as to obtain a gate layer as a stack of metal silicide layer/polysilicon layer, which also reduces the layer resistance of the gate layer.

The method for forming the metal silicide layer on the diffusion layer also includes a method for forming a suicide layer of a metal, such as titanium, only at the bottom of a through hole on the diffusion layer after etching the through hole to the diffusion layer rather than forming the metal silicide layer over the entire surface of the diffusion layer area. This intends to reduce the contact resistance between the metal interconnection layer and the metal silicide layer is formed only at the bottom of the through hole between the metal interconnection layer and the diffusion layer. Subsequently, a contact plug for burying the through hole (hereinafter simply referred to as "plug") is formed. This method is generally used for various semiconductor devices besides memory semiconductor devices.

A second application example of the stacked conductive layer is a gate layer of an MOS transistor. Layers of lower resistance have been used for a polysilicon mono-layer for the gate layer, a stacked gate layer of metal silicide layer/polysilicon layer, and a stacked gate layer of metal layer/metal nitride layer/polysilicon layer. Furthermore, a study on a laminate gate comprising a metal layer/metal nitride layer excluding the polysilicon layer has also been started.

In view of the application of the stacked conductive layer as described above, there is a demand for forming a conductive layer providing satisfactory electric contact to the surface of a lower layer comprising different materials at the bottom of the through holes after etching the through holes for connecting a diffusion layer and an interconnection layer or for connecting a gate layer and an interconnection layer, or after etching the through holes further for connecting plugs to each other.

For example, it has now been required to form a conductive layer providing satisfactory electric contact both for a metal silicide layer and a metal layer at the bottom of the through holes etched on the gate layer comprising a metal silicide layer/polysilicon layer, a metal layer/metal nitride layer/polysilicon layer, and a silicon layer at the bottom of the through holes etched on the silicon layer. Further, if a metal silicide is formed over the entire surface of the diffusion layer, it is necessary to form a conductive layer providing satisfactory electrical contact both for a metal silicide layer at the bottom of the through holes etched on a metal silicide layer/silicon layer of a diffusion layer and for a metal layer at the bottom of the through holes etched on a gate layer comprising a metal layer/metal nitride layer/polysilicon layer.

For example, in an embedded LSI where a logic circuit and a DRAM (Dynamic Random Access Memory) circuit are integrated on a single semiconductor device, or in a DRAM in which a metal silicide film identical with that in a logic semiconductor device formed to a diffusion layer of a peripheral circuit area of a high speed memory, it is necessary to form a conductive layer providing satisfactory electric contact both for the diffusion layer in which a metal silicide layer is formed on the surface of a peripheral circuit areas of a logic circuit and for a plug layer at the bottom of the through holes etched to a plug layer comprising impurity-doped polysilicon in the memory array area.

To avoid hindering the miniaturization of the semiconductor device or complicating manufacturing steps, it is necessary to form a conductive layer in one single step at the bottom of each of the through holes having a lower layer surface comprising different materials as described above.

Further, it has become necessary to form a conductive layer film in one single step at the bottom of a group of through holes of different depth, through holes or openings for local interconnections of different shape and size for the etched area so as to produce smaller and more complicated high performance semiconductor devices. Particularly, the local interconnection technique is indispensable for miniaturization and higher performance of the logic semiconductor device, and the shape of the etched area of openings for local interconnection (hereinafter simply referred to as "local interconnection hole") is generally formed in a rectangular shape with a long side to short side ratio of 2 or more, in a rectangular shape or in an L-shape in which a longitudinal portion has a rectangular shape. The local interconnection is formed by burying the local interconnection hole with a metal layer.

For forming a conductive layer at each of the bottoms for the group of through holes or local interconnection holes having a lower layer surface comprising different materials as described above, or for forming a conductive layer film in one single step to each bottom of the through holes of different depths and to each bottom of the through holes or local interconnection holes having different shapes and sizes of etched area, a manufacturing method of forming a metal film is used. The method includes sputtering, such as titanium, reacting at least a portion of a metal layer in contact with a silicon layer or a metal silicide layer at the bottom of the through holes or local interconnection holes by heat treatment at about 700° C. thereby additionally forming a metal silicide layer so as to reduce the contact resistance to silicon. The heat treatment is conducted just after the sputtering step or the reacting step.

The method is mainly used to provide a titanium silicide layer. The metal silicide layer is necessary for reducing the contact resistance between the silicon layer or silicon-containing metal silicide layer and an upper metal interconnection layer. Particularly, in the plug or local interconnection to silicon, when the plug or interconnection is formed, such as of titanium nitride, since the contact resistance increases if a reaction barrier layer comprising titanium nitride and silicon are brought into direct contact, the metal silicide layer is indispensable.

Further, also in the formation of plugs or local interconnections to a diffusion layer in which a metal silicide layer is formed over entire surface, since the silicon layer may break through the metal silicide layer by excess dry etching upon etching treatment of through holes or local interconnection holes so as to intrude into the through holes or local interconnection holes in which the silicon layer is exposed at the lower portion, it is often necessary to additionally form a metal silicide layer at the bottom of the through holes or local interconnection holes after etching. The Japanese Patent Application No. 112157/1994 discloses a manufacturing method for forming a metal silicide layer by sputtering a metal film of titanium or the like after etching a through hole, reacting a metal film in contact with a silicon layer or a metal silicide layer at the bottom of the through hole with the silicon layer or silicon in the metal silicide layer by heat treatment so as to form a metal silicide layer.

However, it has been found that a layer having a high contact resistance or a diffusion layer causing large leakage current are contained at the bottom of the through holes or local interconnection holes formed by the prior art as described above.

The problem described above becomes most significant when a second heat treatment is subsequently applied in addition to the required minimum heat treatment for forming the metal silicide layer. Particularly, if the metal silicide layer is formed over the entire surface of the diffusion layer, the surface of the diffusion layer or the junction portion of the diffusion layer formed as the metal silicide layer has low heat resistance thereby the second heat treatment often increases the contact resistance between the plug and the surface of the diffusion layer and the leakage current in the diffusion layer.

The insufficiency of the heat resistance depends on the thickness of the metal film formed by sputtering and also depends on the material of the lower layer exposed at the bottom of the contact hole. The lack of heat resistance at the surface of the junction portion of the diffusion layer formed by the prior art causes a significant problem, especially it heat treatment is required at a high temperature of 600° C. or higher in the capacitor forming step of a semiconductor device. In other words, the heat treatment step applied in the course of forming capacitors increases the contact resistance between the plug and the surface of the diffusion layer remarkably or increases the junction leakage current of diffusion layer so as to damage the junction.

The material for the capacitive dielectric film of the capacitors in the memory circuit includes tantalum oxide or BST (barium strontium titanate) which are new in comparison with the traditionally used silicon oxynitride film. Anyway, film deposition or heat treatment at a temperature of 600° C. or higher is necessary to obtain a capacitor with a small leakage current.

Further, film formation or heat treatment at a temperature of 600° C. or higher is also required for manufacturing a memory circuit with a ferroelectric film, such as PZT (lead zirconium titanate) film or a SBT (strontium bismuth tantalate) film.

In the prior art, it was extremely difficult to adopt the heat treatment together with the formation of the metal silicide layer at the bottom of the through holes or on the surface of the diffusion layer for reducing the layer resistance or contact resistance. The heat treatment for forming capacitors is required to increase the etched area of the through hole so as to offset the resulted increase of contact resistance per unit area, which causes a trouble for miniaturization. Further, by lowering the heat treatment temperature in the capacitor step to prevent the increase in the contact resistance or the increase in the junction leakage current of the diffusion layer, it is necessary to increase the thickness of the capacitor dielectric film so as to suppress increase in the leakage current caused by the lowed temperature of the heat treatment. However, this increases the capacitor area, which causes a trouble in miniaturization. In anyway, the problem described above gives a significant trouble in view of the manufacture of a new high performance semiconductor device.

Also in a case of requiring to form a conductive layer in one single step at each of the bottoms of a group of through holes of different depths or through holes or local interconnection holes of different shapes and sizes for the etched area, the layer at the bottom of the through holes or local interconnection holes formed by the prior art method often results in a case where a layer exhibiting high contact resistance with respect to the plug or the local interconnection or a case where the layer in which the leakage current through the connected diffusion layer increases. In this case, it often results in a problem even in a case where heat treatment at high temperature is not applied, especially after forming the layer on the bottom.

Further, along with the demand for miniaturization, a further lower contact resistance by unit area and smaller junction leakage current are demanded even for any shallow junction, which make the prior art even less satisfactory.

The investigation by the inventors reveals that high contact resistance of the bottom layer, a large leakage current of the connected diffusion layer and, further, lack of heat resistance for the bottom layer or the diffusion layer in the prior art are attributable to the formation of a metal silicide layer with a thickness larger than an appropriate range on a layer exposed to the bottom of the through holes or the local interconnection holes, the formation of a metal mixture layer or an alloy layer having a thickness larger than an appropriate range, or the formation of a metal silicide layer with a thickness outside of the appropriate range. Particularly, it has been found that when a high heat treatment is applied after forming the bottom layer of the through hole or the local interconnection, the appropriate thickness range is narrowed.

Generally, when the thickness of the formed metal silicide layer is larger than the appropriate thickness range, the leakage current in the connected diffusion layer increases. Particularly, the junction suffers from damages through the subsequent processing step, which further increases the junction leakage current. If the thickness of the formed metal mixture layer or alloy layer is larger than the appropriate thickness range, the contact resistance increases. By the additional heat treatment, the thickness of the metal mixture layer or alloy layer increases so as to further increase the contact resistance. When the thickness of the metal silicide layer falls below the appropriate thickness range, the contact resistance increases because (1) that the film quality of the metal silicide layer is deteriorated if it is excessively thin, and (2) that the thin metal silicide layer agglomerates by the heat treatment to cause local uneven distribution of the film thickness.

If the bottom of the through hole or the local interconnection hole is exposed when a metal layer is formed at the bottom by sputtering, forming an identical thickness metal film does not depend on the material exposed on the bottom of the through hole so long as the size of the through hole is identical. That is, a metal film of an identical thickness is formed at the bottom of a through hole where silicon is exposed, at the bottom of a through hole where a metal is exposed, and at the bottom of the through hole where a metal silicide is exposed.

The shape of coverage formed with the conventional metal film by sputtering is thicker at the central portion and thinner at the periphery on the bottom of the hole but the thickness is identical in holes made in the same process. When heat treatment is applied subsequently, any metal formed by sputtering is reacted with silicon to form a metal silicide layer at the bottom of the hole where silicon is exposed. Also, at the bottom of the hole where the metal silicide is exposed, any metal formed by sputtering is reacted into a metal silicide layer. At the bottom of the through hole where a metal is exposed, reaction is taken place between the metal and a metal formed further by sputtering to form a metal mixture layer or an alloy layer.

When the thickness of the metal silicide layer formed by reaction with silicon at the bottom of the hole where silicon is exposed is intended to be at an appropriate thickness, the thickness of the metal silicide layer formed at the bottom of the hole where the metal silicide is exposed is often larger than the appropriate thickness. Similarly, at the bottom of the hole where the metal is exposed, a metal mixture layer or alloy layer of an excessive thickness is formed.

When it is intended to form the metal silicide layer formed at the bottom of the hole at an appropriate thickness, the thickness of the metal silicide layer formed at the bottom of the hole where silicon is exposed is often less than the appropriate thickness. Further, at the bottom of the hole where a metal is exposed, a metal mixture layer or alloy layer of a somewhat excessive thickness is formed.

When it is intended to form the metal mixture layer or alloy layer formed at the bottom of the hole where the metal is exposed at an appropriate thickness, the thickness of the metal silicide layer formed at the bottom of the hole where silicon is exposed is often less than appropriate thickness. Further, at the bottom of the hole where the metal silicide is exposed, a metal silicide layer of a somewhat insufficient thickness is formed.

In order not to damage the shallower junction required by miniaturizing a semiconductor device, the upper limit for the thickness of the metal silicide layer in contact with the diffusion layer becomes smaller. Accordingly, the range for the appropriate thickness of the metal silicide layer also becomes smaller, and it is extremely difficult to form a metal silicide layer within an appropriate range of the thickness by the prior art.

It may be theoretically considered to form metal films to the bottoms of the respective through holes by separate steps and forming a metal silicide layer of an appropriate thickness to each of the holes. However, since the layer has to be formed separately, this remarkably increases the number of steps and complicate is the steps. Therefore, it is almost impossible to apply this approach for actual manufacturing. Further, this method requires bigger alignment margins between the layers at the bottom of the through hole or the local interconnection hole, it becomes impractical, particularly, for micro semiconductor devices.

Particularly, in a case of forming a conductive layer at the bottom of local interconnection holes of different shape or different size of etched area by one single step, since the coverage by sputtering greatly depends on the aspect ratio of the local interconnection hole (depth to diameter ratio), the layer at the bottom of the local interconnection hole formed by the prior art by sputtering often contains high resistance or causes a larger junction leakage current from the connected diffusion layer to the well or the substrate.

It is impossible to classify the local interconnection holes into several groups according to size and shape so as to form metal films to the local interconnection holes of the respective groups separately by sputtering and to form a metal silicide layer of an optimal thickness for each of the holes.

As has been described above in the etching process, in a dielectric film, at least two groups of through holes or local interconnection holes, among a first group of through holes or local interconnection holes in which a layer having a surface comprising silicon as a major constituent element is exposed at the bottom, a second group of through holes or local interconnection holes in which a layer having a surface comprising a first metal silicide as a major constituent element is exposed at the bottom, and a third group of through holes or local interconnection holes in which a layer having a surface comprising a first metal as a major constituent element is exposed at the bottom, it was impossible by the prior art method to form a layer with a low contact resistance and a small junction leakage current from a diffusion layer and having a high heat resistance at the bottom for all of the holes simultaneously.

SUMMARY OF THE INVENTION

This invention solves the foregoing problems in the prior art so as to provide a manufacturing method of a semiconductor device with low contact resistance and sufficiently small junction leakage current from a diffusion layer in connection with plugs or local interconnections. This also provides a semiconductor device of higher integration density and higher performance. The manufacturing method maintains a sufficiently small junction leakage current from the diffusion layer and low contact resistance via a heat treatment step at high temperature after forming the diffusion layer and plugs to be connected therewith, thereby providing a highly integrated memory semiconductor device or a high performance memory/logic embedded LSI with micro-sized plugs.

Additionally, this invention provides a manufacturing method of a semiconductor device with a sufficiently small leakage current from the diffusion layer and low contact resistance even if its through holes having different depth, or the through holes or local interconnection holes having different shape and size of etched areas. This provides a high performance logic semiconductor device or a high performance memory/logic embedded LSI having fine plugs or local interconnections.

A manufacturing method of a semiconductor device according to this invention for attaining the principal object includes a step of forming a layer comprising a second metal silicide as a major constituent element on a layer having a surface comprising silicon or a first metal silicide as a major constituent element, and a layer comprising a second metal as a major constituent element on a layer having a surface comprising a first metal as a major constituent element, simultaneously, by one single chemical vapor deposition process to the bottom of each of openings of at least two out of three of openings groups. In the first group of through holes or local interconnection holes, a layer having a surface comprising silicon as a major constituent element is disposed at the bottom ("through holes or local interconnection holes" are hereinafter collectively referred to as "openings"). In the second group of openings, a layer having a surface comprising a first metal silicide as a major constituent element is disposed at the bottom. In the third group of openings, a layer having a surface comprising a first metal as a major constituent element is disposed at the bottom etched in a dielectric film on a substrate.

A manufacturing method of a semiconductor device according to this invention for attaining the additional object comprises including a step of simultaneously forming, by one single chemical vapor deposition process, a layer comprising a second metal silicide as a major constituent element on a layer having a surface mainly comprising silicon or first metal silicide as a major constituent element, and a layer having a second metal as a major constituent element on a layer having a surface comprising a first metal as a major constituent element, to the bottom of each of a group of through holes having an etched area on the surface of the dielectric film shaped substantially circular or square, i.e., substantially symmetrical with respect to the central point of the etched area, and each bottom for each of openings having an etched area in the surface of the dielectric film shaped rectangular with a pair of long sides twice or more longer than a pair of short sides.

Another manufacturing method of a semiconductor device for attaining the additional object of the invention includes a step of simultaneously forming, by one single chemical vapor deposition process, a layer comprising a second metal silicide as a major constituent element on a layer having a surface comprising silicon or a first metal silicide as a major constituent element to the bottom of each of the first group of through holes, where a layer having a surface comprising silicon or first metal silicide as a major constituent element is disposed at a bottom, and to the bottom of each of the second group of through holes, where a layer having a surface comprising silicon or a first metal silicide as a major constituent element is disposed to the bottom. Each of the second group of through holes has a depth by twice or more deeper than each of the first group of through holes.

The manufacturing method of a semiconductor device according to this invention will be explained more specifically. For example, the plasma CVD process is practiced by using plasmas of a gas mixture comprising titanium tetrachloride and hydrogen such that a titanium silicide layer is formed on silicon when the temperature of the substrate is sufficiently high.

This is because the reaction between titanium and silicon proceeds on silicon and a reaction layer forms a silicide layer simultaneously with the formation of titanium layer by the plasma CVD process. See Technical Digest, IEDM (December, 1996), pages 361–364. It is described that the reaction between titanium and silicon proceeds on silicon at a substrate temperature of 570° C. or higher. Further, it has also been described that the rate of forming the titanium silicide layer on silicon increases along with the increase of the substrate temperature, while the rate of forming the titanium layer on silicon dioxide is substantially saturated and constant.

A method for forming a metal silicide layer of titanium simultaneously on polycrystal silicon of the source, the drain, and the gate layer of an MOS transistor is described in U.S. Pat. No. 5,703,972.

Although not described in the cited patent, it is known that it is also possible not to form the titanium layer substantially on silicon dioxide by selecting the conditions of the chemical vapor deposition process.

On the other hand, based upon the experiment by the present inventors, when the same processing (one single plasma CVD process) is applied on metal, such as tungsten, simultaneously, on silicon, the titanium layer, even if formed on the metal, such as tungsten, remains as a titanium layer since reactant silicon is not present. This may be anticipated from the result on silicon dioxide described above but it is demonstrated also by the experiment.

It has been found from the experiment described above that the rate of forming the titanium layer on the metal is substantially constant within a temperature range while the titanium silicide layer is formed in the same manner on silicon dioxide. Further, it has also been found that the formation rate is identical for the dielectric film other than silicon dioxide (ex, silicon nitride).

Furthermore, a metal silicide layer of thin thickness is formed on the metal silicide layer compared with that on silicon when one single film deposition processing is applied on the silicide layer of metal, such as titanium, simultaneously with that on silicon. This is because the reaction between titanium and silicon proceeds on silicide simultaneously with the formation of the titanium layer in the same manner as that for the formation of the titanium silicide layer on silicon when the metal is titanium so as to form a titanium silicide layer, but the thickness of the resulted titanium silicide layer is reduced since the amount of silicon near the surface is smaller than that on the silicon.

In the experiment described above, a plasma CVD process by titanium tetrachloride and hydrogen was used, but the kind and the thickness of the film to be formed generally differ depending on the material on the substrate surface. This is also true in forming the silicide layer by utilizing the reaction with silicon on the substrate surface.

Further, similar effects are obtained by a plasma CVD process using halides of metal (such as tantalum, tungsten or molybdenum), cobalt compounds having carbonyl groups (dicobalt octacarbonyl $Co_2(CO)_8$, a cobalt tricarbonyl nitrosyl $(Co(CO)_3NO$, etc.) or an organic material containing the metals described above as one of starting materials. This was also applicable in a chemical vacuum deposition process using titanium tetrachloride or the like as a starting material.

In each of the chemical vapor deposition processes described above, the coverage shape does not depend on the depth, shape or size of the etched area as in a sputtering process for forming the conductive film in one single step the inside of opening of different shape or the size of the etched area.

The invention is different from the prior art that at least two out of three groups openings are present on the substrate. In the first group of openings, a layer comprising silicon as a major constituent element is exposed at the bottom. In the second group of openings, a layer comprising a metal silicide as a major constituent element is exposed at the bottom. In the third group of openings, a layer comprising a metal as a major constituent element is exposed at the bottom. While one single chemical vapor deposition process is applied simultaneously on the three groups of the openings, and layers of different materials or different thickness are formed onto the bottom of the respective openings.

In a case of forming a conductive layer by one single step inside each of the through holes of different depths or sizes, and each of the openings different in the shape or the size of an etched area. The coverage shape does not depend on the depth, the shape or the size the etched area as in a sputtering process.

As has been described above, through holes of low contact resistance and with small junction leakage current for the connected diffusion layer can be formed simultaneously by one single CVD process. Further, even after heat treatment at a high temperature for forming the diffusion layer and the through holes, it still has a small leakage current from the diffusion layer and low contact resistance in a memory semiconductor device having micro-sized through holes, a capacitor device, or a high performance semiconductor device embedded with a memory circuit and a logic circuit.

While this invention is most effective for manufacturing a memory semiconductor device or memory logic embedded LSI, it is also applicable to manufacture other semiconductor devices, such as logic semiconductor devices.

Other and further objects, features and advantages of the invention will appear more fully from the following description.

BRIEF DESCRIPTION OF THE DRAWINGS

The preferred embodiments of the present invention are illustrated in the accompanying drawings in which.

DETAILED DESCRIPTION OF THE PREFERRED EMBODIMENTS

Figure 1:
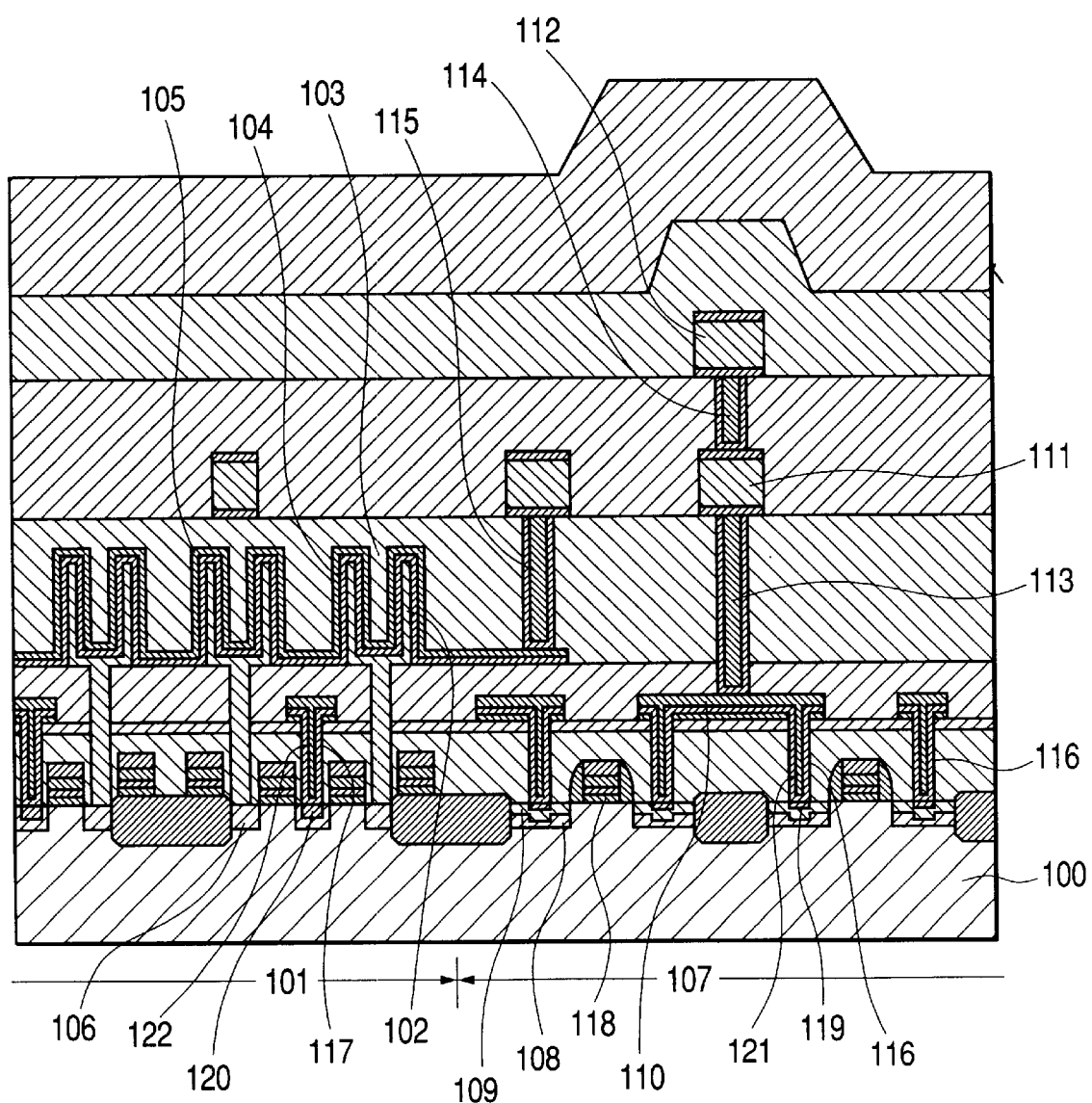
FIG. 1 is a cross sectional view for explaining a semiconductor device manufactured by a first embodiment according to a semiconductor manufacturing method of this invention.

The method for manufacturing a semiconductor device according to this invention is to be explained in details by way of several embodiments illustrated in the drawings with reference to the preferred embodiments of the invention.
<Embodiment 1>

A first embodiment of the invention for manufacturing memory/logic embedded LSI is to be explained with reference to FIG. 1 through FIG. 6. Specifically, this invention is applied to a manufacturing step of a plug for connecting a first interconnection layer with a layer comprising plural materials.

FIG. 1 shows a cross section of a memory/logic embedded LSI to which this invention is applied. In a memory array area 101 on the main surface of a silicon substrate 100, a three dimensional capacitor 103 using tantalum oxide as a principal dielectric layer 102 is formed. A lower electrode layer 104 is formed of polysilicon and an upper electrode layer 105 is formed of titanium nitride.

A diffusion layer 106 in the memory array area 101 is silicon itself but a cobalt silicide layer 110 is formed to the surface of a diffusion layer 108 in a logic circuit area 107 which contains peripheral circuits of a memory. A first interconnection layer (bit line in the memory circuit) 110 is a stacked interconnection of a tungsten layer and a titanium nitride layer, and each of a second interconnection layer 111 and a third interconnection layer 112 is a stacked interconnection comprising an aluminum alloy layer located vertically between the titanium nitride layers. Plugs (multi-layered plug) 111, 114 formed of a tungsten layer and a titanium nitride layer are connected between the first interconnection layer 110 and the second interconnection 111 and between the second interconnection layer 111 and the third interconnection layer 112 respectively. A similar multi-layered plug 115 also connects the first interconnection layer 111 with the upper electrode layer 104 of the capacitor.

The stacked film of the first interconnection layer 110 was formed simultaneously with burying of stacked film into through holes 116, 117 for connecting the first interconnection layer 110 and the underlayer. The plugs 121, 122 are formed by burying. The through hole 116 is in the logic circuit area in which the cobalt silicide layer 109 is exposed at the bottom of the hole upon etching. A through hole 117 is in the memory array area 101 in which the silicon of the diffusion layer 106 is exposed onto the bottom of the hole upon etching.

After etching the through holes 116, 117, a titanium silicide layer 119 of about 7 nm thick, a titanium layer (not illustrated) of about 3 nm thick, and a titanium silicide layer 120 of about 15 nm thick are formed simultaneously on the bottom of the through hole 116 etched in the logic circuit area 107 for connecting the first interconnection layer 110 and the diffusion layer 108 having the cobalt silicide layer 109 formed at the surface, at the bottom of a through hole (not illustrated) etched in the logic circuit area 107 for connecting the first interconnection layer 110 and the tungsten layer of the stacked gate layer 118 (word line in the memory circuit), and at the bottom of the through hole 117 etched in the memory array area for connecting the first layer wiring interconnection 110 and the diffusion layer 106 respectively by one single chemical vapor phase deposition (CVD) process. The manufacturing method of the semiconductor device shown in FIG. 1 is to be explained specifically.

Figure 2A:
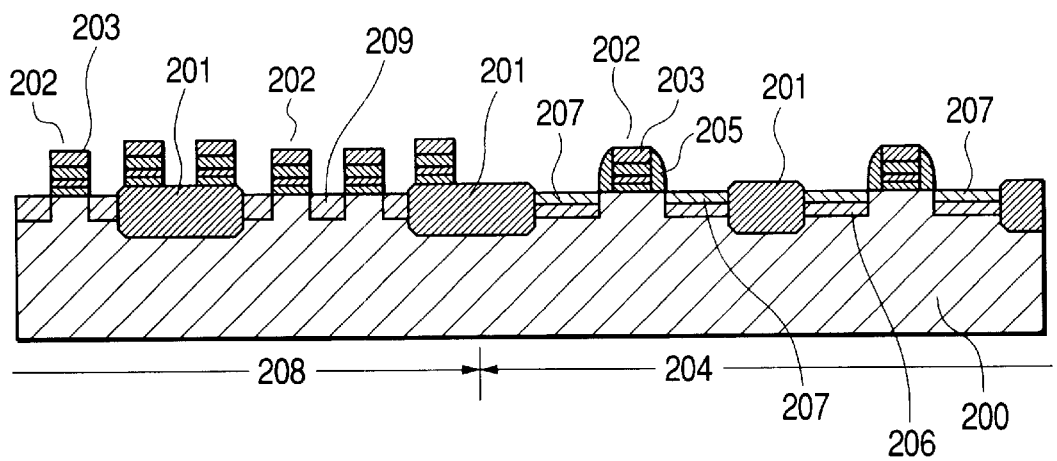
FIGS. 2A–2C the first set of sequential charts explaining the first embodiment of the semiconductor manufacturing method of this invention in FIG. 1.

FIG. 2A shows a cross section of a silicon substrate 200 at the intermediate manufacturing step for a memory/logic embedded LSI shown in FIG. 1. After preparing a shallow trench device isolation area 201, an MOS transistor 202 is formed.

A gate layer 203 is a stacked conductive layer of tungsten/ tungsten. nitride/impurity-doped polysilicon, and a cap layer comprising silicon dioxide is present on the gate layer 203. A side wall 205 comprising silicon dioxide is formed on the gate layer 203 in a logic circuit area 204 which includes peripheral circuits of the memory.

An impurity area is prepared by introducing various impurities forms a diffusion layer. The depth of the diffusion layer 206 in the logic circuit area 204 is about 90 nm from the surface of the silicon substrate for both n⁻ and p⁻ diffusion layers. The depth for the diffusion layer 206 is determined based on the depth at a density of $1\times10^{18}$ N or more per cubic centimeter. A cobalt silicide layer 207 of about 15 nm thick is selectively formed on the surface of the diffusion layer 206 in the logic circuit area 204. The cobalt silicide layer is not formed on the surface of a diffusion layer 209 in the memory array 208.

The cobalt silicide layer 207 is formed by the following method. At first, after covering the entire main surface of the substrate 200 with a silicon dioxide film, the silicon dioxide film in the logic circuit area 204 is removed by a well-known photolithography and wet etching technique. After cleaning with an aqueous hydrofluoric solution, a cobalt film of 8 nm thick is formed by sputtering and the cobalt silicide layer 207 is formed selectively only onto the diffusion layer area 206 in which the silicon substrate 200 is exposed by rapid thermal annealing nitrogen at 670° C. for one minute. In this stage, the cobalt silicide layer 207 does not form into the lowest resistance phase.

After removing an unreacted cobalt film and a reaction product layer of cobalt and silicon dioxide on the silicon dioxide film by wet etching with a mixed solution of sulfuric acid/hydrogen peroxide, rapid thermal annealing is applied to argon at 800° C. for one minute. This forms a cobalt silicide layer 207 with a low, resistance phase on the surface of the diffusion layer 206. The cobalt silicide layer 207 is about 15 nm thick.

Figure 2B:
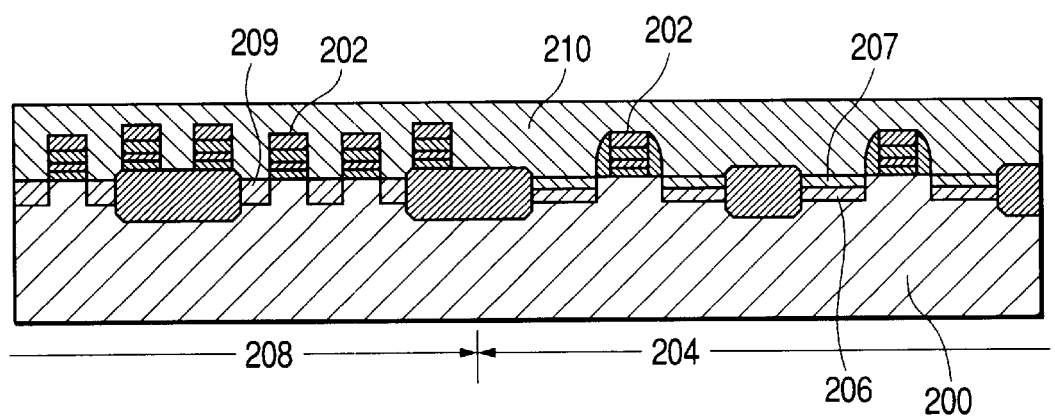

Then, as shown in FIG. 2B, an interlayer dielectric film 210 is formed to cover the MOS transistor 202, the diffusion layer 209, and the cobalt silicide layer 207 which is on the diffusion layer 206, and the surface is planarized by CMP (Chemical Mechanical Polishing). The interlayer dielectric film 210 used in this embodiment is a silicon dioxide film formed from silane and nitrogen sub-oxide (the starting material) by plasma CVD with high density plasmas. The thickness of the interlayer dielectric film 210 measured after CMP from the original surface of the silicon substrate 200 was about 0.35 μm.

Figure 2C:
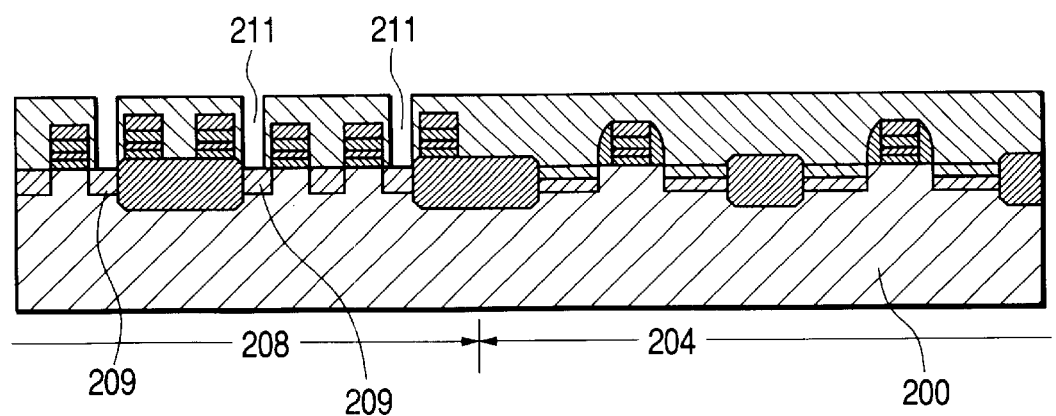

Subsequently, as shown in FIG. 2C, a through hole 211 is etched for connecting the lower electrode of the capacitor and the diffusion layer 209 in the memory array 208. The through hole 211 etched by the well-known electron beam lithography and dry etching technique has a diameter of about 0.12 μm. A phosphorus-doped silicon film is formed by a low pressure CVD process, and the silicon film on the interlayer dielectric film 210 is removed by the CMP method to form polysilicon plugs 212 shown in FIG. 3A.

Figure 3A:
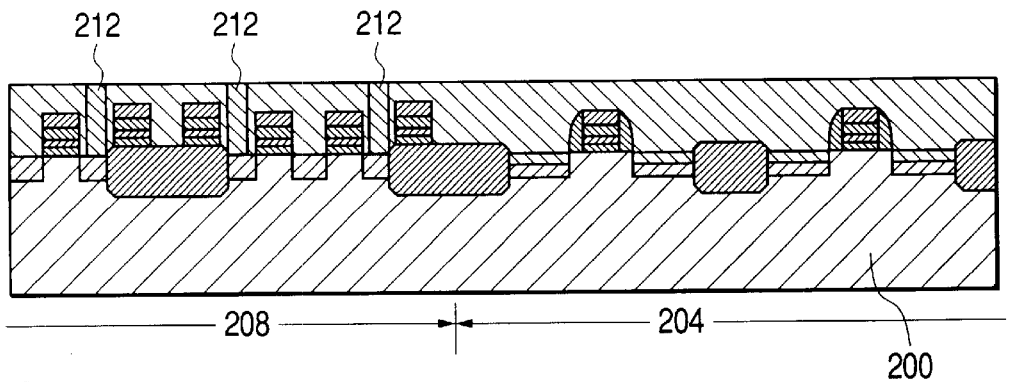
FIGS. 3A–3D are the second set of sequential charts explaining the first embodiment.
Figure 3B:
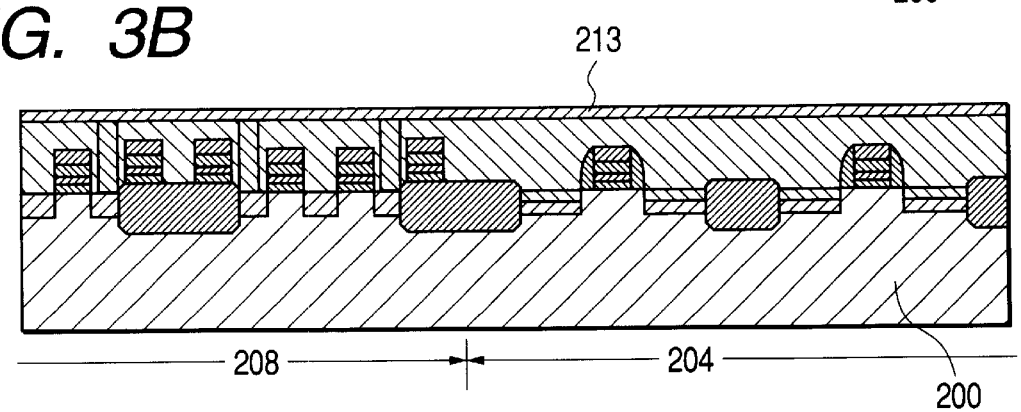
Figure 3C:
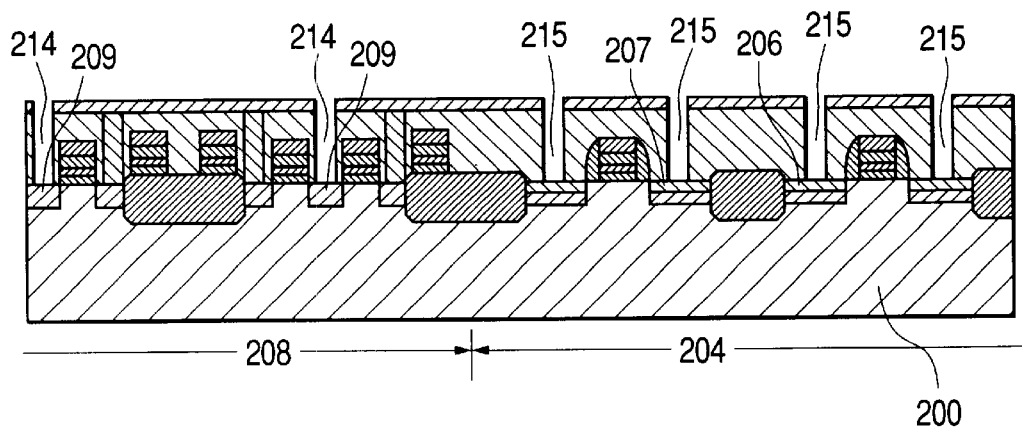
Figure 3D:
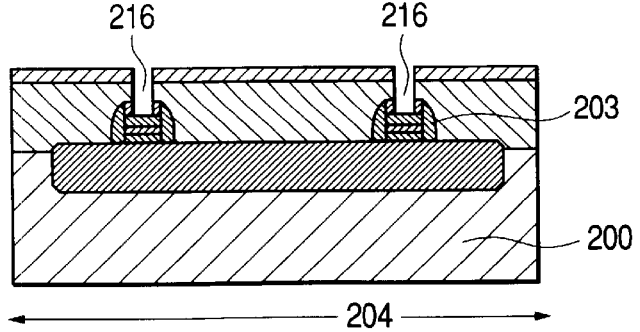

Then, as shown in FIG. 3B, after forming a silicon dioxide film 213 over the entire main surface of the silicon substrate 200, through holes 214 for connecting a first interconnection layer and the diffusion layer 209 in the memory array area 208, through holes 215 for connecting the first interconnection layer and the diffusion layer 206 in the logic circuit area 204, and through holes 216 shown in FIG. 3D for connecting the first interconnection layer and the gate layer 203 in the logic circuit region 204 are etched simultaneously.

FIG. 3D shows a portion of another cross section of the silicon substrate 200. The diameter for each of the through holes 214, 215 and 216 etched by the well-known electron beam lithography and dry etching technique is about 0.12 μm. In this case, the three groups of through holes 214, 215 and 216 are etched simultaneously. Since, the depth of the through hole 216 for connecting the first interconnection layer and the gate layer 203 in the logic area 204 is different from that of other through holes 214, 215, the through hole 216 may be etched by a separate step.

The surface of the diffusion layer 209 in the memory array area 208 is made of silicon, the cobalt silicide layer 207 is present on the diffusion layer 205 in the logic circuit area 204, and the surface of the gate layer 203 in the logic circuit area 204 is made of tungsten. The three materials were exposed in the lower portions of the respective through holes by etching the three groups of the through holes 214, 215 and 216.

Figure 4:
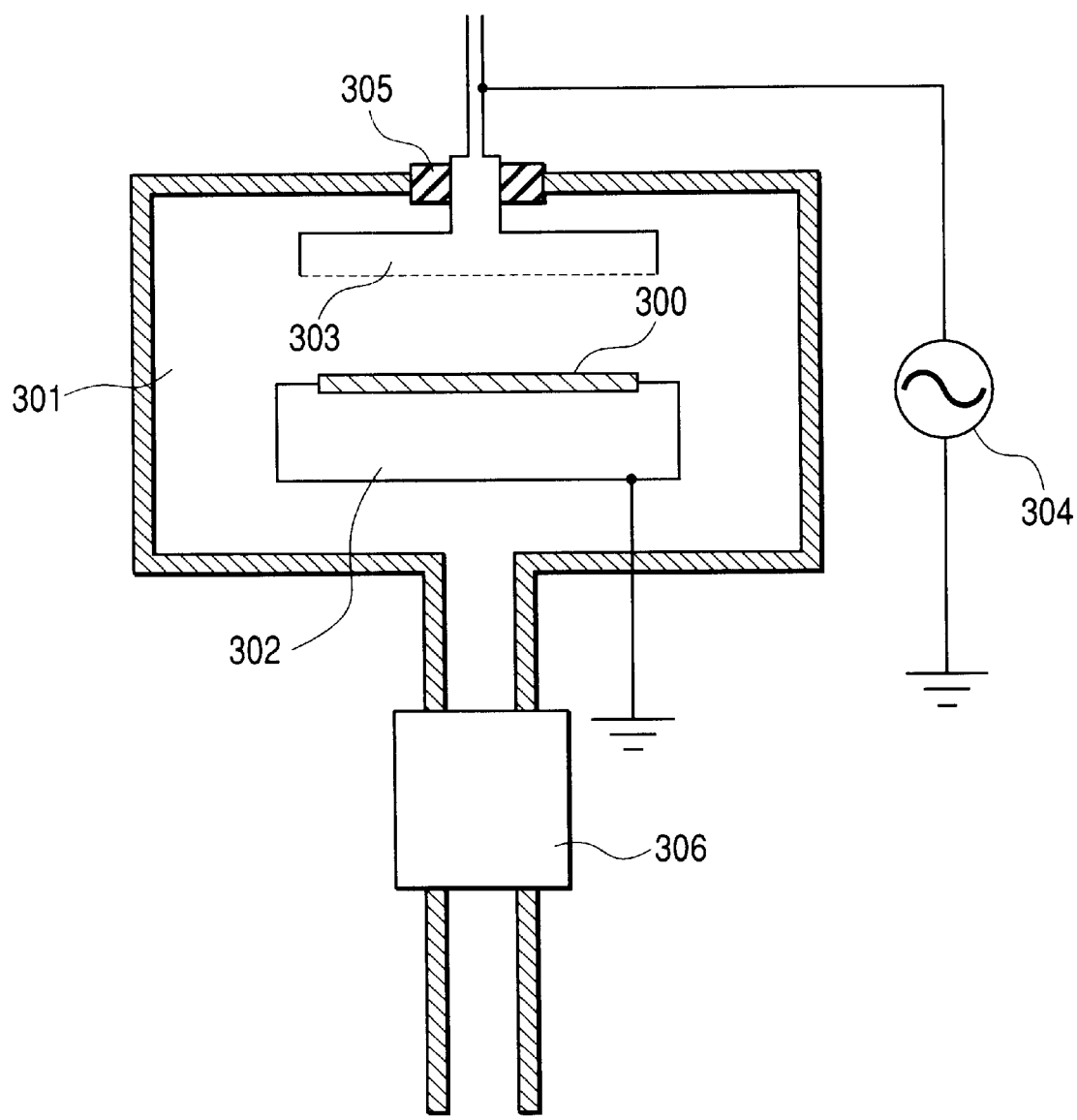
FIG. 4 is a circuit diagram of an apparatus in the first embodiment.

FIG. 4 shows a plasma chemical vapor deposition apparatus used in this embodiment. After cleaning a silicon substrate 300 in a intermediate manufacture step of the memory/logic embedded LSI described above, the LSI is placed on a specimen table 302 in a reactor 301 at a reduced pressure of the plasma chemical vapor deposition apparatus shown in FIG. 4. The surface of the specimen table 302 contacting with the silicon substrate 300 is pre-heated to 660° C. After introducing 10 sccm of titanium tetrachloride and 700 sccm of hydrogen from a shower head 303, a radio frequency power of 800 W at 450 KHz is applied by a radio frequency power source 304. The shower head 303 is insulated by an insulator 305 from the reactor 301. Plasma discharge is generated by applying the radio frequency power between the shower head 303 and the silicon substrate 300, as well as between the shower head 303 and the specimen table 302 opposed thereto. During discharging, the pressure in the reactor 301 is reduced to 70 Pa with a vacuum exhaustion pump. 306.

Figure 5A:
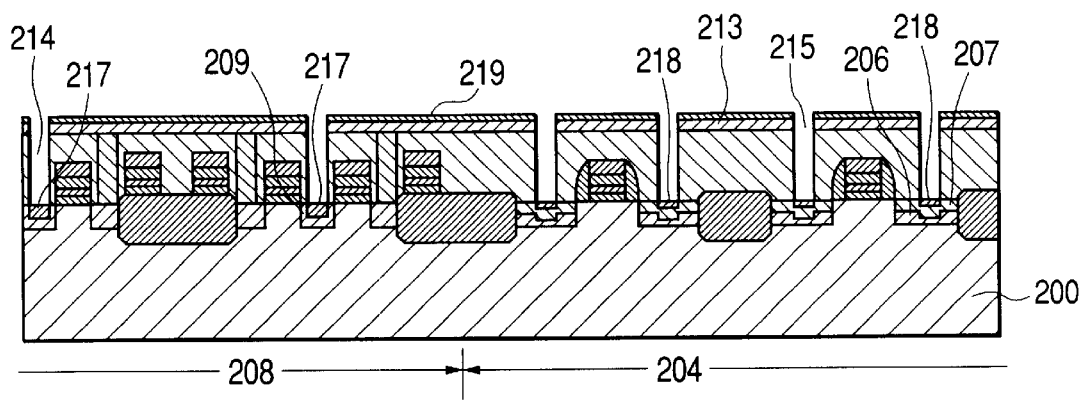
FIGS. 5A–5D are the third set of sequential charts explaining the first embodiment.

By discharging for two minutes, a titanium silicide layer 217 of about 15 nm thick is formed on the diffusion layer 209 comprising silicon onto the bottom of the through hole 214 in the memory array area 208 as shown in FIG. 5A.

A layer 218 mainly comprising titanium silicide of about 7 nm thick is further formed on the cobalt suicide layer 207 on the surface of the diffusion layer 206 at the bottom of the through hole 215 in the logic circuit layer 204. The layer 218 mainly comprising titanium silicide in this embodiment contains cobalt. The cobalt content varies depending on the processing conditions by the apparatus shown in FIG. 4. It is possible not to incorporate cobalt at all. By the deposition of the titanium silicide layer 218, a portion of the cobalt silicide layer 207 becomes the deeper position of the substrate 200.

A titanium film 219 of about 3 nm thick is formed on the planarized silicon dioxide film 213. The film is scarcely deposited on the silicon dioxide film 213 on the side wall inside the through holes 214 and 215.

Figure 5B:
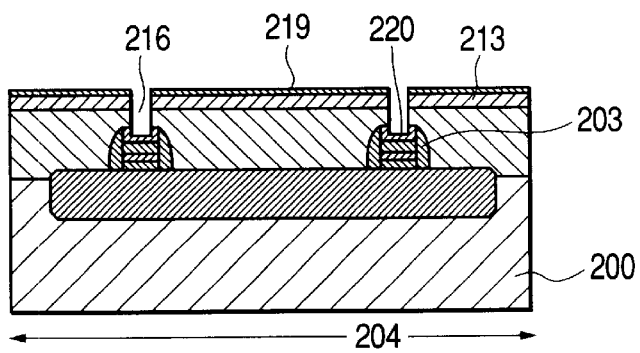

FIG. 5B is a view illustrating a portion of another cross section for the silicon substrate 200. A titanium film 220 of about 2 nm thick is formed on the tungsten layer of the stacked gate layer 203 at the bottom of the through hole 216 in the logic circuit area 204. The film is scarcely formed on the silicon dioxide film 213 on the side wall inside the through hole 216.

As described above, in this embodiment, the titanium silicide layer 127, the layer 218 mainly comprising titanium silicide, and the titanium film 220 are formed simultaneously by one single CVD process.

Then, after introducing 700 sccm of nitrogen from the shower head 303 in the same reactor 301 as used in the previous processing of the apparatus shown in FIG. 4, a radio frequency power of 500 W at 450 KHz is applied to the substrate 200 for one minute by the radio frequency power source 304 to nitride the titanium film 219 on the planarized silicon dioxide film 213 shown in FIGS. 5A, 5B so as to form a substantially titanium nitride film 219. The nitridation is a processing for improving the adhesion to the silicon oxide film 213. The titanium layer 220 on the gate layer 203 is also nitrided by the processing.

Figure 5C:
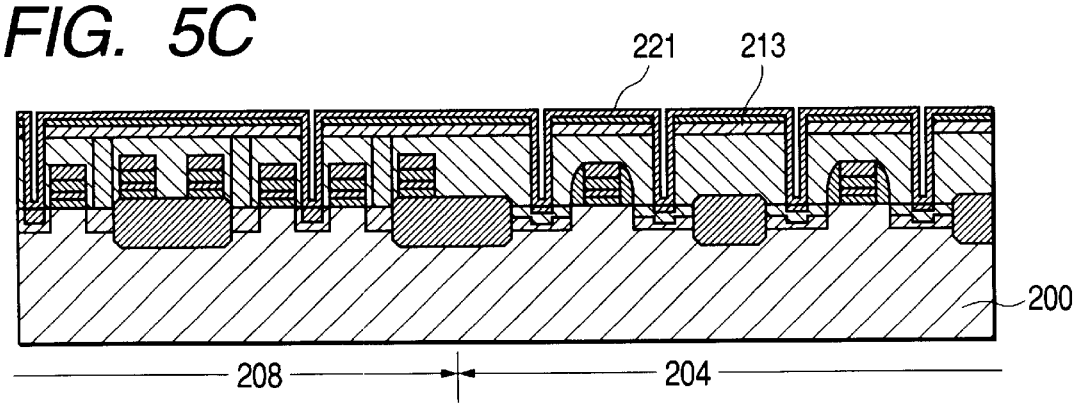
Figure 5D:
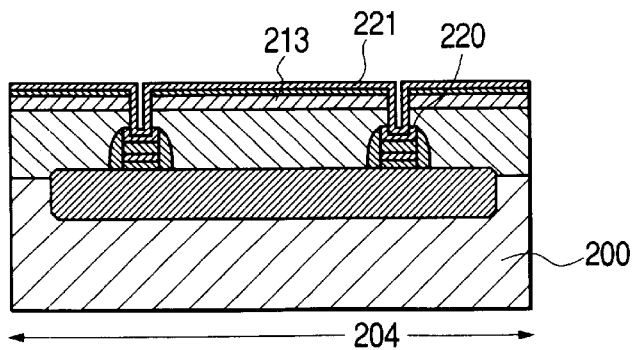

Then, the silicon substrate 200 becomes another reactor (not illustrated) connected by a vacuum transfer chamber (not illustrated) of the apparatus shown in FIG. 4 and the titanium nitride film 221 of 20 nm thick is formed by CVD using titanium tetrachloride and ammonia as starting materials as shown in FIGS. 5C&5D. The temperature for forming the titanium nitride film 221 is 580° C.

Figure 6A:
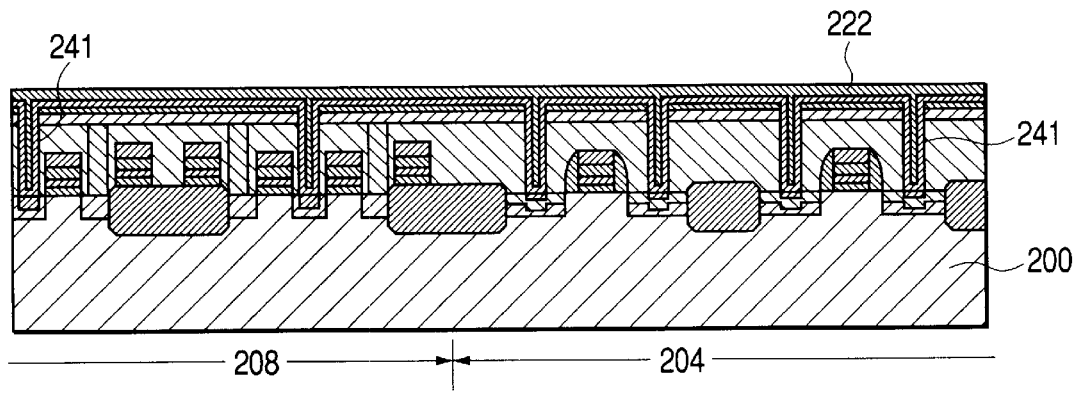
FIGS. 6A–6D are the forth set of sequential charts explaining the first embodiment.
Figure 6B:
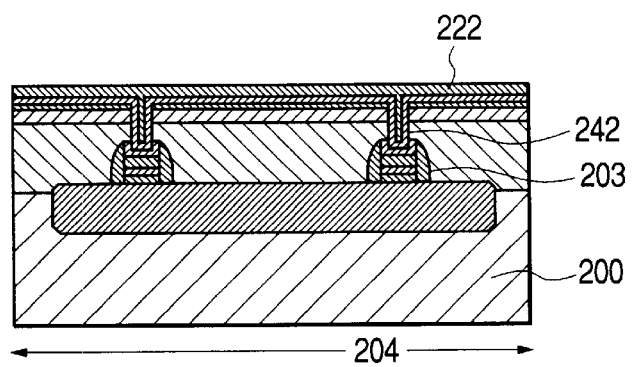

Further, in another reactor (not illustrated) of the apparatus shown in FIG. 4, a tungsten film 222 of 70 nm thick is formed by CVD using tungsten tetrafluoride and hydrogen as shown in FIGS. 6A, 6B. The temperature for forming the tungsten film 222 is 430° C.

By forming the titanium nitride film 221 and the tungsten film 222 described above, plugs 241 are formed in the through holes 214, 215 and plugs 242 are formed in the through holes 216.

Figure 6C:
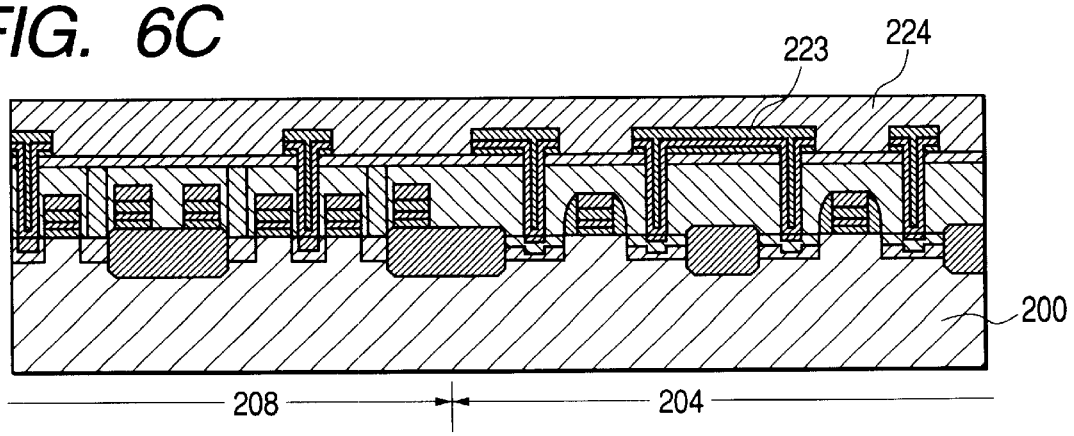
Figure 6D:
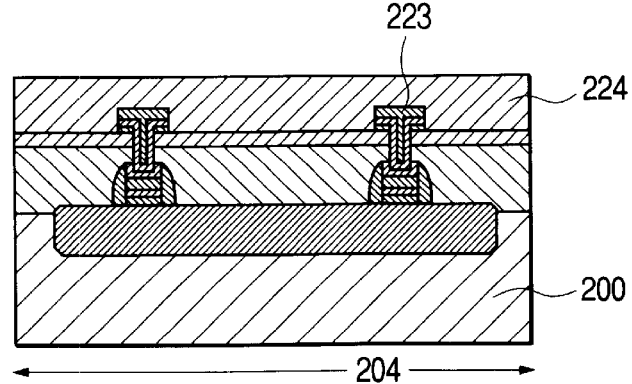

Subsequently, as shown in FIGS. 6C, 6D, patterning is applied to the stacked conductive film comprising the tungsten film 222 and the titanium nitride films 219, 221 by the well-known lithography and dry etching technique with an exposure device using fluorine krypton lasers as a light source to form a first interconnection layer 223. Further more, a silicon dioxide film 224 is formed and the surface is planarized by the CMP method. The method of forming the silicon dioxide film 224 is the same as that for the silicon dioxide film 210, which is a plasma CVD process using high density plasmas.

In this embodiment, the titanium nitride film 221 and the tungsten film 222 which are identical with those layers formed inside the three groups of the through holes 214, 215 and 216 are used to form the first interconnection layer 223 as described above. Alternatively, the first interconnection layer 223 may be formed by removing the films on the silicon dioxide film 213 except the titanium nitride film 221 and the tungsten film 222 formed inside the through holes 214, 215 and 216 after forming the films 221 and 222 by CMP, and then forming the film as the first interconnection layer 223. Both in the method of this embodiment and in the case of forming the first interconnection layer after CMP, the processing of nitriding the titanium film 219 on the silicon dioxide film 213 into a titanium nitride film 219 is eliminated.

Figure 7A:
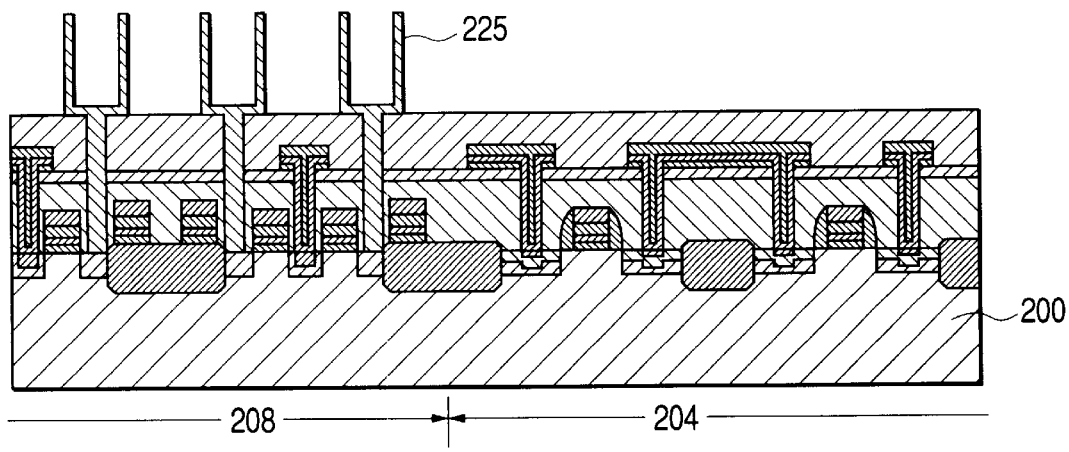
FIGS. 7A–7C are the fifth set of sequential charts explaining the first embodiment.

As shown in FIG. 7A, a lower electrode layer 225 comprising polysilicon is formed in a memory array by a subsequent processing to the substrate 300.

Figure 7B:
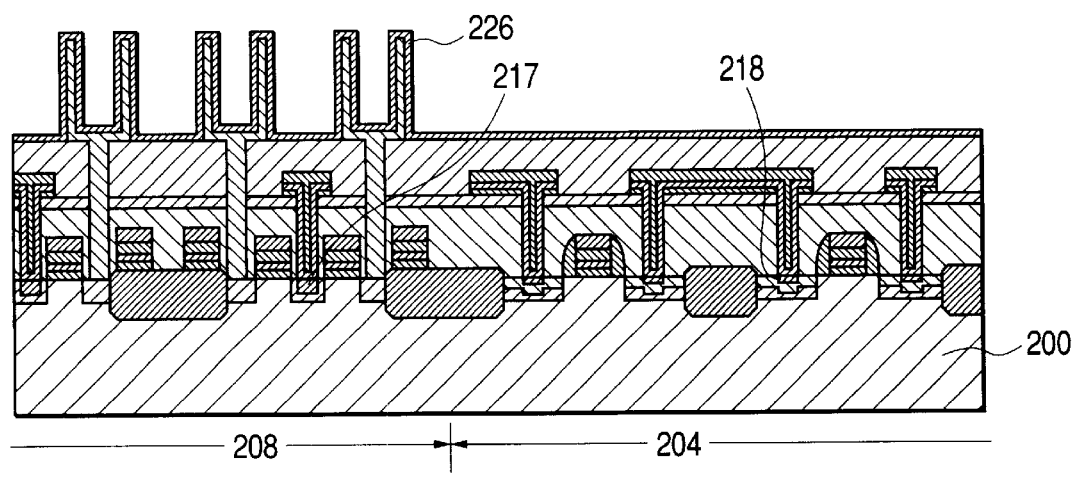

After applying rapid thermal annealing at 800° C. for one minute on ammonia to the substrate 200 described above nitride onto the surface of polysilicon of the lower electrode layer 225, a tantalum oxide film 226 of 9 nm thick is formed by a low pressure CVD using penta ethoxy tantalum and oxygen as starting materials as shown in FIG. 7B. The temperature for forming the tantalum oxide film 226 by CVD is 480° C. After forming the tantalum oxide film 226, heat treatment is conducted in oxygen at 800° C. for seven minutes to oxidize the surface of the lower electrode 225 and, simultaneously, to crystallize the tantalum oxide film 226.

It is well-known that the tantalum oxide film formed by CVD exhibits large leakage current and that the capacitor using the same material and method for the dielectric film has low break down voltage since the dielectric constant is also small. Then, the heat treatment after forming the film adopted in this embodiment is indispensable in a capacitor using the tantalum oxide film as the dielectric film. A capacitor comprising the tantalum oxide film 226 as the main dielectric film has sufficient break down voltage and capacitance obtained by the heat treatment.

Also in most dielectric thin films other than those made of tantalum oxide, leakage current is large from the film formed by CVD or sputtering. For example, if a BST film formed by CVD or sputtering, heat treatment annealing oxygen at high temperature 600° C. or higher is required after forming the film for obtaining high capacity break down voltage. The heat treatment is a thermal process at the highest temperature after forming the first interconnection layer 222. Upon heat treatment, the resistivity of the titanium silicide layers 217, 218 are lowered without large change in the thickness. That is, the titanium silicide layer 217 remained about 15 nm thick while the titanium suicide layer 218 remained about 7 nm thick.

Figure 7C:
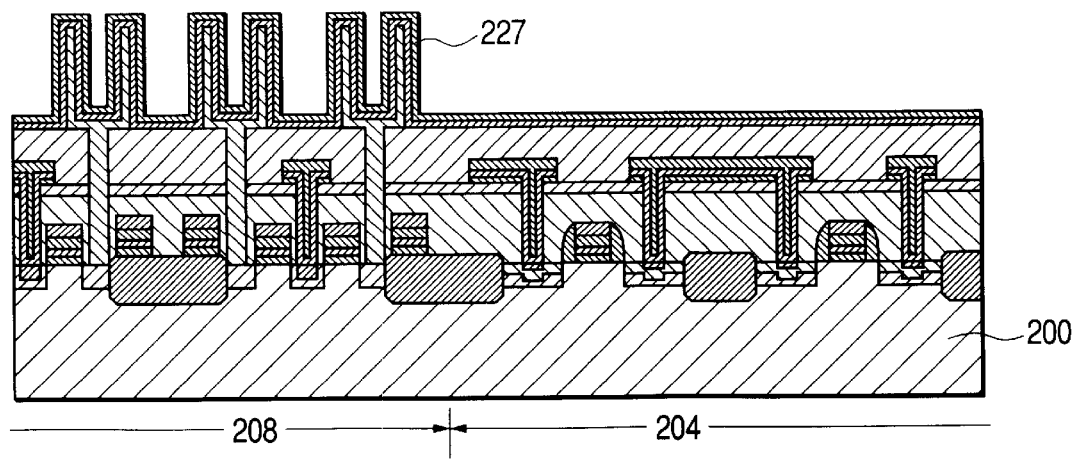
Figure 8A:
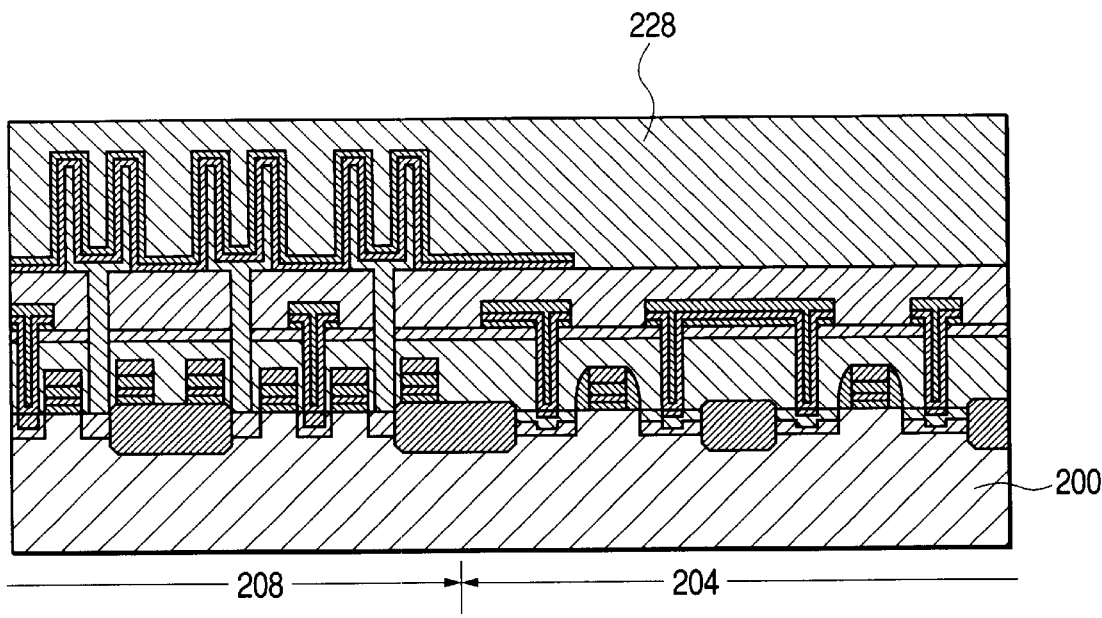
FIGS. 8A and 8B are the sixth set of sequential charts explaining the first embodiment.

As shown in FIG. 7C, a titanium nitride film 227 as an upper electrode is formed by CVD. The temperature for forming the titanium nitride film is 520° C. The step is advanced further by patterning applied to the titanium nitride film 227 and the tantalum oxide film 226 of the upper electrode so as to form a silicon dioxide film 228 on the capacitor, and the surface is flattened again by CMP as shown in FIG. 8A. The method for forming the silicon dioxide film 228 is identical with that for the silicon dioxide film 210, i.e., plasma CVD.

Figure 8B:
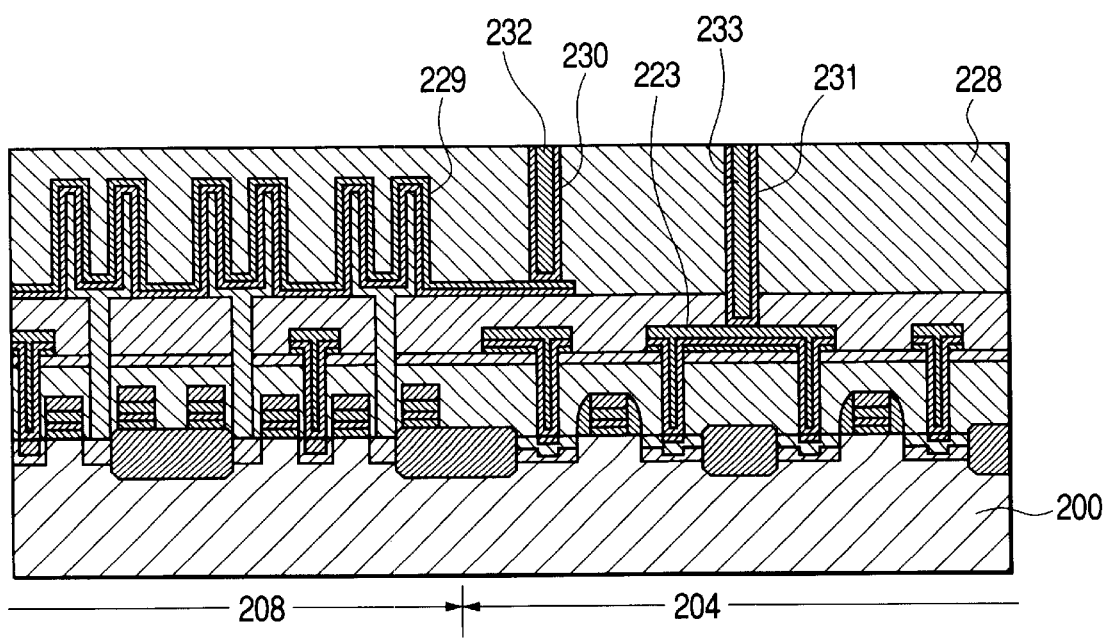

Subsequently, through holes 230 and 231 for connecting a second interconnection layer and the upper electrode layer 229 of the capacitor and for connecting the second interconnection layer and the first interconnection layer 223 are etched by applying the well-known electron beam lithography and dry etching technique, a titanium nitride film and a tungsten film are formed successively by the same method. Further, the tungsten film and the titanium nitride film on the planarized silicon dioxide film 228 are polished and removed by CMP to form plugs 232 and 233 each comprising a stacked conductive film of tungsten and titanium nitride as shown in FIG. 8B.

Figure 9A:
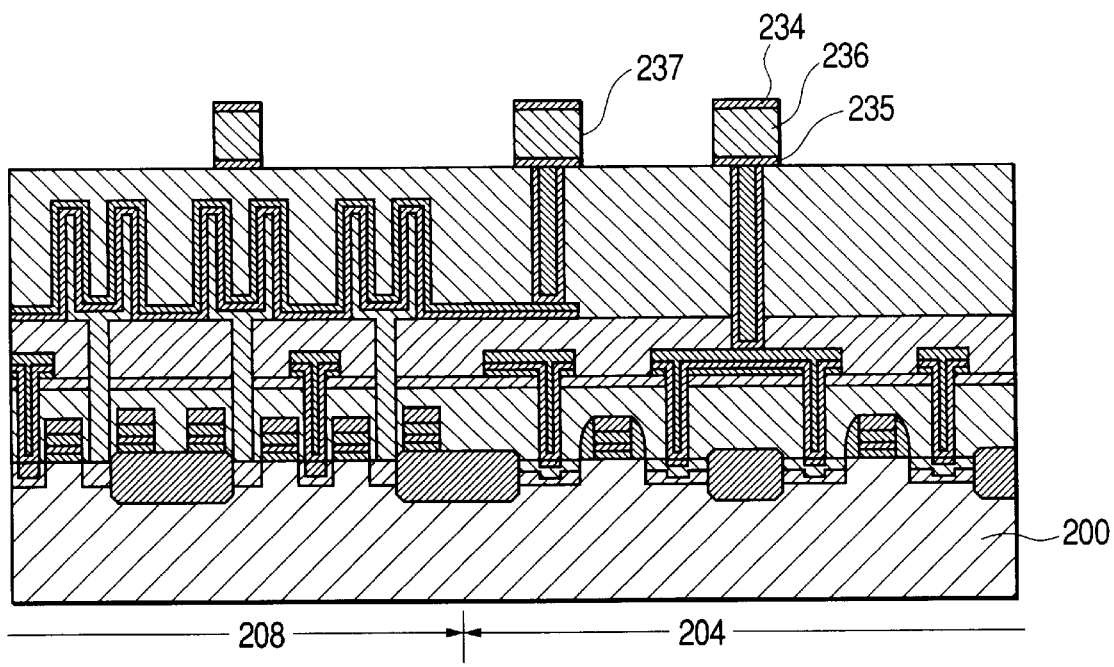
FIGS. 9A and 9B are the seventh set of sequential charts explaining the first embodiment.

Then, as shown in FIG. 9A, a second interconnection layer 237 comprising an aluminum alloy layer 236 containing 0.5% by weight of copper sandwiched vertically between titanium nitride layers 234 and 235 is formed. The film of the titanium nitride layers 234 and 235 and the aluminum alloy layer 236 are deposited by sputtering. Patterning is then applied by the lithography and dry etching technique with an exposure device using fluorine krypton lasers as a light source.

Figure 9B:
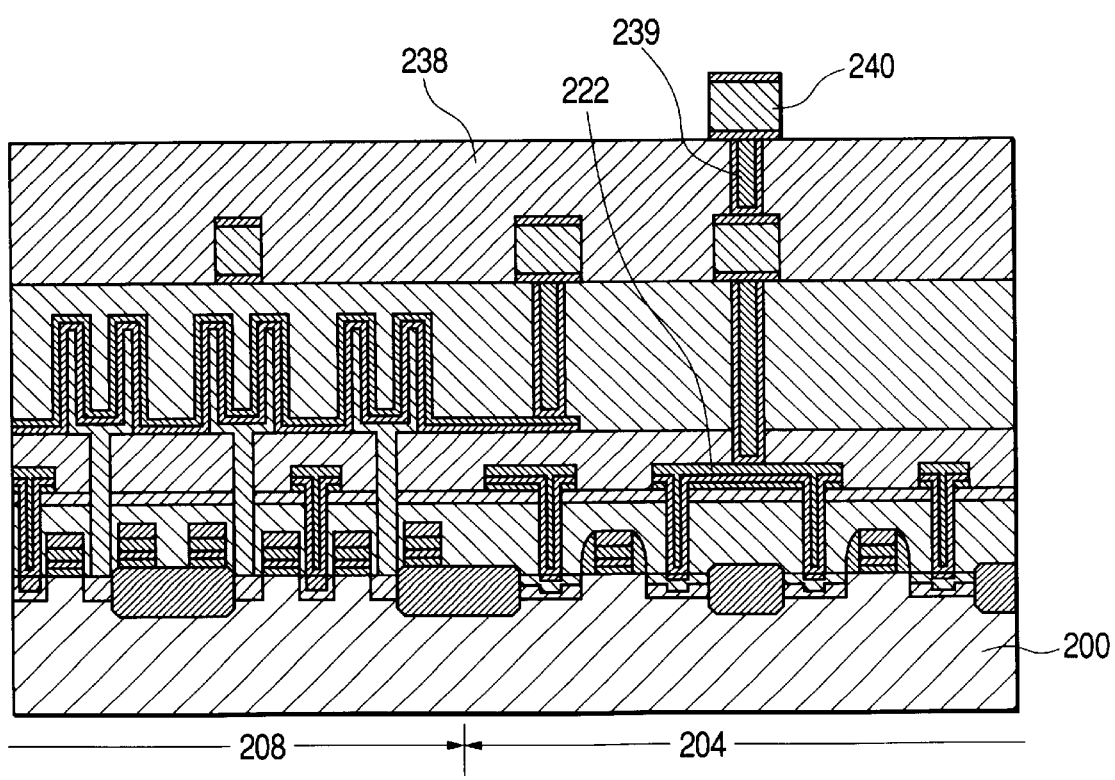

Subsequently, as shown FIG. 9B, after forming a silicon dioxide film 238 in the same manner as for the silicon dioxide film 228 and then planarizing the same, a plug 239 comprising a multi-layered conductive film of tungsten and titanium nitride for connecting the upper interconnection layer and the second interlayer connection 237 is formed in the etched area of the silicon dioxide film 238, and then a third interconnection layer 240 is formed. The third interconnection layer 240 is also an aluminum alloy layer vertically placed between the titanium nitrite layers, and the forming method is identical with that for the second interconnection layer 237.

When a silicon dioxide film and a silicon nitride film are successively formed to the main surface of the substrate for protecting the semiconductor device and an etched section is formed for connection with the outside, a memory/logic embedded LSI formed on the silicon substrate 100 shown in FIG. 1 is obtained.

Figure 10A:
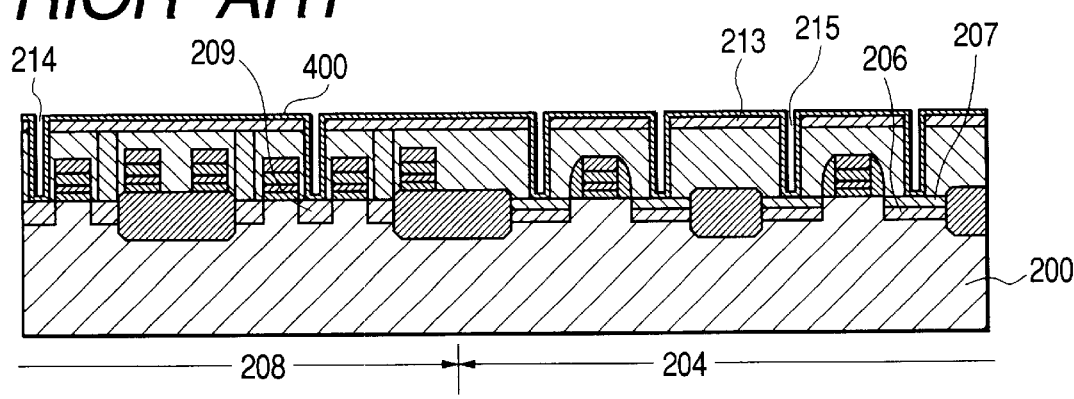
FIGS. 10A–10D are a cross-sectional view of a comparative embodiment of the prior art with respect to the first embodiment.
Figure 10B:
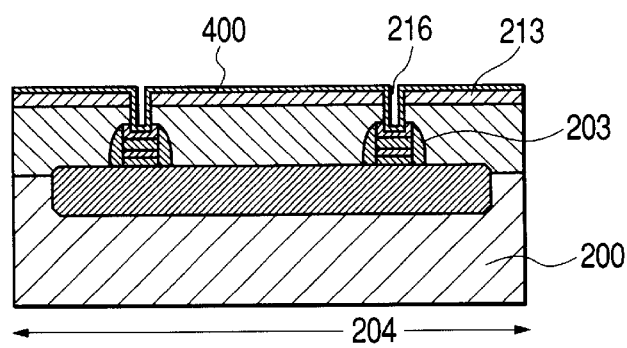

For comparison, a memory/logic embedded LSI can also be produced by the existent method. A silicon substrate 200 in the intermediate manufacture stage of the memory/logic embedded LSI shown in FIGS. 3C, 3D is placed on a specimen table of the sputtering apparatus, and then a titanium film 400 of 50 nm thick is formed on the planarized silicon dioxide film 213 over the entire main surface by sputtering to form a structure as shown in FIGS. 10A, 10B.

A titanium film 400 formed by sputtering has a coverage shape inherent in sputtering (over hang shape) due to the shadowing effect of the surrounding silicon dioxide film 213 inside the through holes 214 and 215 which is thick in the central portion and thin at the periphery at the bottom of the through holes 214 and 215. The thickness of the titanium film 400 at the central portion is about 7 nm. The thickness of the titanium film 400 in the central portion at the bottom of the through hole 216 is about 10 nm.

Subsequently, the titanium film in contact with the silicon diffusion layer 209 or the cobalt silicide layer 207 is reacted with silicon by rapid thermal annealing at 700° C. for one minute on argon to form a titanium silicide layer. In this step, a portion of the titanium film 400 in contact with tungsten of the stacked gate film 203 reacts with tungsten.

Figure 10C:
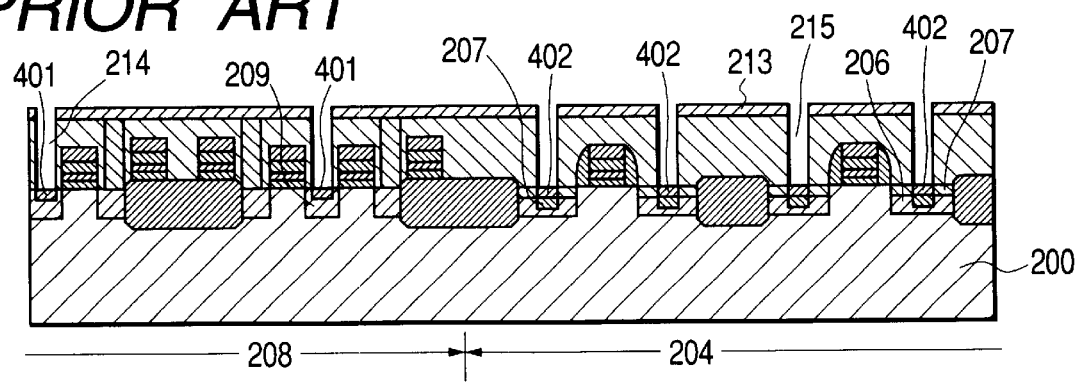
Figure 10D:
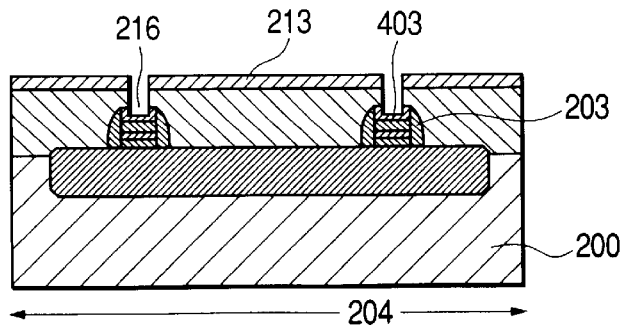

Successively, when an unreacted titanium film, a reaction product layer of titanium and silicon dioxide on the silicon dioxide film 213, and an unreacted titanium film on tungsten of the stacked gate layer 203 are removed by wet etching with a mixed solution of hydrogen peroxide/ammonia, a structure as shown in FIGS. 10C, 10D is formed. The removing step is adopted because the titanium film 400 of the overhand shape to avoid hindering burying the titanium nitride film and the tungsten film into the through holes 214, 215 and 216. A titanium silicide layer 401 of about 15 nm thick (thickest at the central portion) is formed on the diffusion layer 209 comprising silicon at the bottom of the through hole 214 in the memory array area 208.

A titanium film 402 of about 15 nm thick (thickest at the central portion) is further formed on the cobalt silicide layer 207 on the surface of the diffusion layer 206 at the bottom of the through hole 215 in the logic circuit area 204. The titanium film over the silicon dioxide film 213 on the side wall inside the through holes 214 and 215 is removed by wet etching. A film 403 comprising an alloy or a mixture of titanium and tungsten of about 2 nm thick (thickest at the central portion) is formed on the tungsten layer of the stacked gate layer 203 at the bottom of the through hole 216 in the logic circuit area 204. The titanium film not yet reacted with tungsten on the silicon dioxide film 213 on the side wall and on the gate layer 203 inside the through hole 216 is removed by wet etching.

The same processing as those in Embodiment 1 according to this invention may be applied to the substrate 200 formed with the prior art method after forming the titanium nitride film so as to manufacture a semiconductor device similar to the memory/logic embedded LSI shown in FIG. 1.

Characteristics of the devices are measured by using a pattern for testing the memory/logic embedded LSI according to this invention. A step of selectively removing a portion of the cobalt silicide layer in the logic circuit area is added for measuring the characteristics, so that the contact resistance between the diffusion layer and the first interconnection layer in the logic area (i.e., resistance from the first interconnection layer by way of the titanium silicide layer to the diffusion layer) is also measured. The characteristics can be measured in the same manner also for the semiconductor devices made by the prior art method.

There is no substantial difference in the contact resistance of through holes of 0.12 μm diameter between the first interconnection layer and the diffusion layer having the silicon surface in the memory array area between the semiconductor device made according to this invention and those in the semiconductor device made by the prior art method. The contact resistance between the first interconnection layer and the diffusion layer in the logic circuit layer, in which a cobalt silicide layer is formed over the entire surface, is measured by an evaluation pattern in which the first layer wiring and the cobalt silicide layer are connected by way of through holes of 0.12 μm diameter, and the cobalt silicide layer and the diffusion layer by way of etched areas of 0.3 μm×0.3 μm.

When the resistance of each through hole is measured by the Kelvin method, the contact resistance is 1.1 KΩ in average for a p⁻ diffusion layer and 700Ω in average for an n⁺ diffusion layer in the semiconductor device according to this invention. On the other hand, the contact resistance is 1.6 KΩ in average for the p⁺ diffusion layer and 1.1 KΩ in average for the n⁺ diffusion layer in the semiconductor device of the prior art, which is about 1.5 times higher than the semiconductor device according to this invention. Further, for each of n⁺ and p⁻ through holes, the value of the standard deviation indicative of the scattering of the contact resistance is smaller by about 50% in the semiconductor device according to this invention.

For the through holes of 0.12 μm diameter between the first interconnection layer and the gate layer in the logic circuit area in which tungsten is present on the surface, the contact resistance for each through hole is measured by the Kelvin method is 52.3 Ω in average in the semiconductor device according to this invention. While the contact resistance is 83.5 Ω in average in the semiconductor device of according to the prior art and, accordingly, the resistance is about 40% lower in the semiconductor device made according to this invention. Further, the value of the standard deviation indicative of the scattering of the resistance is about 40% smaller in the semiconductor device made according to this invention.

Further, the junction leakage current of the diffusion layer is measured by using a pattern in which about 10,000 of through holes of 0.12 μm diameter are formed on the diffusion layer. For the through holes between the first interconnection layer and the diffusion layer, there is no substantial difference in terms of junction leakage current both for n⁻ and p⁺ diffusion layers between the semiconductor device made according to this invention and the semiconductor device made by the prior art method. For the through holes between the first interconnection layer and the diffusion layer in the logic circuit area in which the cobalt silicide is formed over the entire surface, the junction leakage current of the n+ and p− diffusion layers is about one digit smaller in the semiconductor device made according to this invention compared with the semiconductor device made by the prior art method.

By observing the cross section at the bottom of the through holes by a scanning electron microscope or transmission electron microscope, it is found in the semiconductor device made according to this invention that titanium silicide of about 15 nm thick is formed on the silicon diffusion layer at the bottom of the through holes in the memory array area, and titanium suicide of about 15 nm thick is formed at an identical position of the semiconductor device made by the prior art method. There is no remarkable difference between both of the titanium silicide layers except that the titanium silicide layer formed by the manufacturing method according to this invention is uniform in thickness.

Figure 11A:
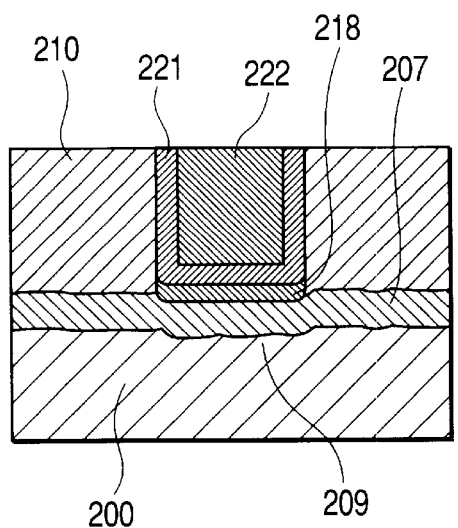
FIGS. 11A and 11C are cross sectional views for explaining the effect of the first embodiment verse those of the prior art in FIGS. 11B and 11D.
Figure 11B:
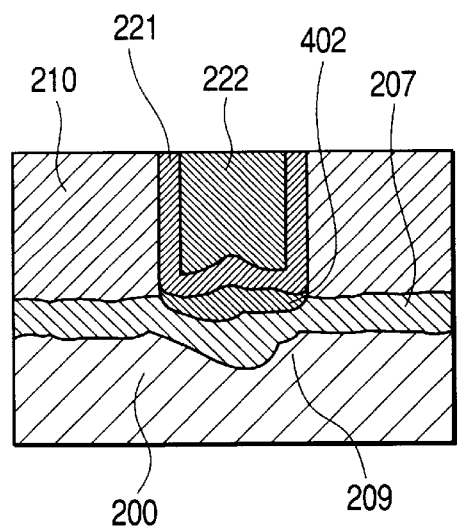

FIGS. 11A, 11B show the bottoms of the respective through holes in the logic circuit area of the semiconductor devices according to the present invention and the prior art. The result observed by a scanning electron microscope is depicted as an example. In the semiconductor device made according to the manufacturing method of this invention in FIG. 11A, a layer 218 comprising titanium silicide as a major constituent element of about 7 nm thick is formed on a cobalt silicide layer 207 of about 15 nm thick on the surface of the diffusion layer at the bottom of the through hole to the diffusion layer 209 in the logic circuit area where a cobalt silicide 207 is formed on the surface. As such, the layer 218 comprising titanium silicide as the major constituent element further contains cobalt. The cobalt silicide layer at the bottom of the through hole etched in the silicon dioxide film 210 moves toward the deeper side of the substrate 200. A titanium nitride film 221 and a tungsten film 222 are formed on the titanium silicide layer 218.

To the contrary, in the semiconductor device of the prior art shown in FIG. 11B, a titanium silicide layer 402 of about 15 nm thick at most thick portion is formed on a cobalt silicide layer 207 of about 15 nm thick on the surface of the diffusion layer 200. The titanium silicide layer 402 also contains cobalt. The cobalt silicide layer 207 at the bottom of the through hole moves to a deeper side of the substrate 200 and, further, the film thickness is not uniform and partially exceeds the original thickness of about 15 nm, or even 25 nm. It is assumed to be agglomerated from the surrounding cobalt silicide layer during the heat treatment step for manufacturing the capacitor.

Observed by the scanning electron microscope, the contact resistance between the first interconnection layer and the diffusion layer within the logic circuit area in which a cobalt silicide layer is formed over the entire surface is higher in the semiconductor device of the prior art, which may be attributable to the thickness of the titanium silicide layer and the cobalt silicide layer at the bottom of the through hole which is excessively large. The cobalt silicide layer and the silicon diffusion layer are in contact with each other by an area of low impurity concentration. It is also possible that the cobalt silicide layer formed thicker by agglomerating which increases contact resistance due to low density of the cobalt silicide and deteriorated film quality.

To the contrary, in the semiconductor device according to this invention, since the thickness of the titanium silicide layer and the cobalt silicide layer at the bottom of the through hole is within an appropriate range, the contact resistance is lower than that of the semiconductor device of the prior art.

Further, the difference of the junction leakage current from the diffusion layer can be explained by the difference of the thickness between the titanium silicide layer and the cobalt silicide layer at the bottom of the through hole. That is, in the semiconductor device of the prior art, it is considered that the locally thickened titanium silicide layer and the cobalt silicide layer break through the junction at a depth of about 30 nm from the surface of the substrate.

Figure 11C:
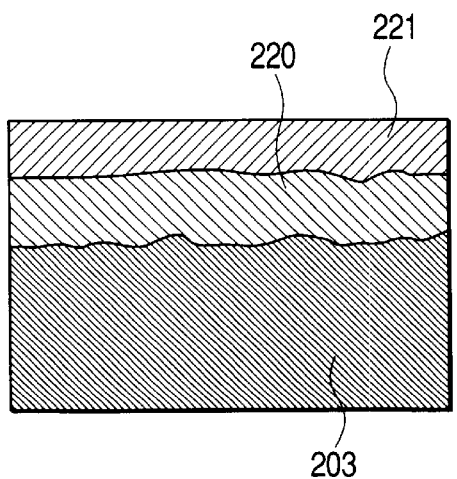
Figure 11D:
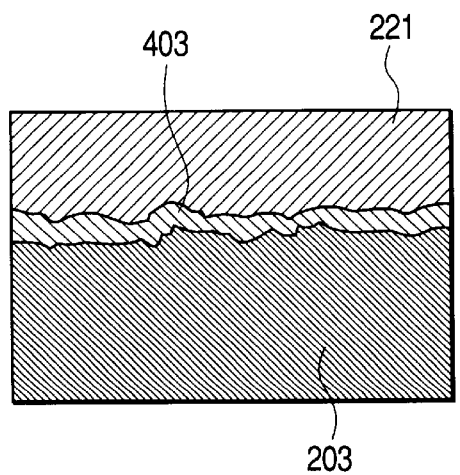

FIGS. 11C, 11D show the bottoms of the respective through holes to the gate layer in the semiconductor devices according to this invention and the prior art. The observed result by a transmission electron microscope is depicted as an example. A titanium nitride film 220 is formed on the tungsten uppermost layer of the stacked gate layer 203 of the semiconductor device according to this invention in FIG. 11C.

This was formed by nitriding the titanium film of about 3 nm thick by CVD. A portion of the titanium nitride film 221 formed by CVD is in the upper layer thereof which has a thickness of about 4 nm.

To the contrary, in the semiconductor device of the prior art, a film 403 comprising an alloy or mixture of titanium and tungsten of about 2 nm thick is present on the uppermost tungsten layer of the stacked gate layer 203. A portion of the titanium nitride film 221 formed by CVD is in the upper layer thereof. It is considered that the film 403 comprising the alloy or mixture of titanium and tungsten is formed during heat treatment after forming the titanium film by sputtering. The film 403 comprising the alloy or mixture of titanium and tungsten has a high resistivity, and the contact resistance with upper and lower films, i.e., with the uppermost tungsten layer of the stacked gate layer 203 or the titanium nitride layer 221, is also high. The existence of the film 403 comprising the alloy or the mixture of titanium and tungsten causes the contact resistance of the through holes between the first interconnection layer and the gate layer within the logic circuit area, in which more tungsten is in the surface in the semiconductor device of the prior art than that in the semiconductor device according to this invention.

The decrease of the resistivity described above according to this invention enables higher performance and lower leakage current which reduces power consumption. Accordingly, it is possible to manufacture a memory/logic embedded LSI with less power consumption, high performance, and a high integration density.

The cobalt silicide layer is formed onto the surface of the diffusion layer in the logic circuit area in this embodiment. However, the effect of this invention can be obtained by using other metal silicide layers, such as a titanium silicide layer, a nickel silicide layer, a tungsten silicide layer or a molybdenum silicide layer than the cobalt silicide. The effect of this invention can also be obtained by substituting the silicide layer comprising a single kind of metal with silicide layers comprising plural metals, or with compound layers of plural metals and silicon, such as a mixed layer of titanium and cobalt silicides, a mixed layer of cobalt and nickel suicides, a mixed layer of titanium and nickel silicide, a titanium and tantalum silicide layer, or a compound layer comprising titanium and cobalt silicon, or a compound layer comprising titanium and silicon formed on the surface of the diffusion layer.

The metal silicide layer formed after etching the through hole is a titanium silicide layer in this embodiment but a similar effect can also be obtained by forming a silicide layer of other metal than titanium, such as cobalt, nickel, tungsten molybdenum, or their combination made by CVD. Such a layer of plural metals and silicon may be a mixed layer of titanium and tungsten silicides, a mixed layer of cobalt and nickel suicides, a mixed layer of titanium and cobalt silicides, a mixed layer of titanium and tantalum suicides, a compound layer comprising titanium tungsten and silicon, or a compound layer comprising titanium, tantalum and silicon.

Further, while a tantalum oxide film is used as the main capacitor dielectric film in this embodiment, the same effect can be obtained by in a tantalum oxide film doped with impurities such as silicon or titanium, or by a barium strontium titanate (BST) film since a heat treatment at 600° C. or higher is generally required after forming the through hole. Further, the effect of this invention is also obtainable by applying to the manufacture of a non-volatile memory semiconductor device with a ferroelectric film, such as a PZT film or SBT film.

<Embodiment 2>

FIG. 12 shows the second embodiment of the invention for manufacturing a memory semiconductor device. Specifically, this invention is applied to manufacture a gate layer and through holes for connecting a first interconnection layer with layers comprising plural materials, and through holes of different depth for connecting the first interconnection layer and the silicon layer.

Figure 12A:
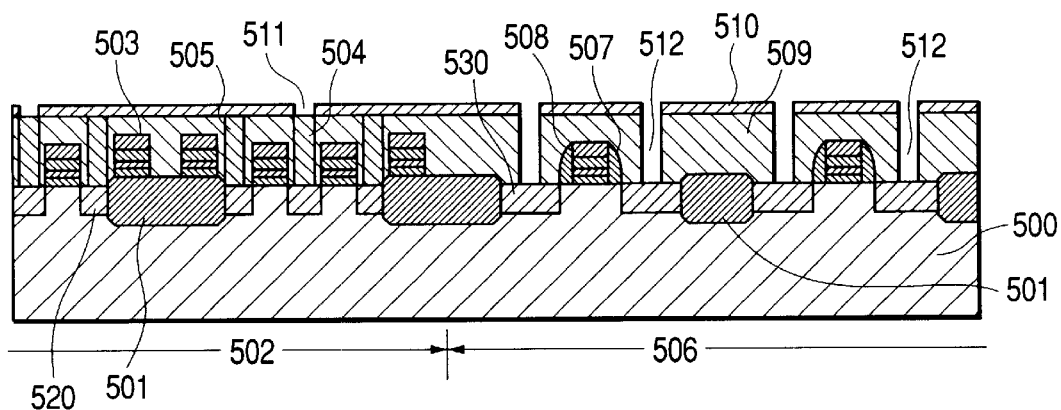
FIGS. 12A–12D are for a set of sequential charts explaining a second embodiment according to this invention.

FIG. 12A shows a silicon substrate 500 in the intermediate step of producing a memory semiconductor device. Shallow trench device isolation areas 501 are formed on the main surface of the silicon substrate 500.

In a memory array area 502, an MOS transistor 503, a polysilicon plug 504 for connecting the first interconnection layer (bit line in the memory circuit), and a diffusion layer and a polycrystal silicon plug 505 for connecting one of the electrodes of a capacitor and the diffusion layer are formed.

Within a peripheral circuit area 506, an MOS transistor 507 is formed. A gate layer 508 for the MOS transistors 503 and 507 is a stacked conductive layer comprising refractory metal/titanium nitride/titanium silicide/impurity-doped polysilicon. Tungsten is used as the refractory metal in this embodiment. The contact resistance between polysilicon and titanium nitride is reduced by inserting a titanium silicide layer about 3 nm thick between the titanium nitride layer and the polycrystalline silicon layer doped with impurities by CVD, which results in a problem in the semiconductor device having a stacked gate layer comprising a tungsten/titanium nitride/impurity-doped polycrystalline silicon layer.

If other metal than titanium, such as tungsten, is used in the metal nitride in this embodiment, the insertion of a thin titanium silicide layer formed by CVD between the metal nitride and the polysilicon provides the same effect. Further, this invention is applicable when substituting the polycrystalline silicon layer with a silicon/germanium layer.

After manufacturing the shallow trench device isolation area 501 and washing the silicon substrate 500 formed with a polycrystalline silicon film doped with impurities (as a portion of the gate layer) by an aqueous hydrophobic acid, the specimen is placed on a specimen table in a reactor under a reduced pressure of the plasma CVD apparatus the same manner as in the Embodiment 1. The specimen table for placing the silicon substrate is pre-heated at 580° C. After introducing 7 sccm of titanium tetrachloride and 400 sccm of hydrogen, a radio frequency power of 300 W at 350 kHz is applied to generate plasmas. A titanium silicide layer of about 3 nm thick is formed on the polycrystalline silicon film by electric discharge for 40 seconds.

Then, the silicon substrate 500 is transferred to a separate reactor connected by a vacuum transfer chamber in the same apparatus. A titanium nitride film of 10 nm thick is formed on the substrate 500 by CVD using titanium tetrachloride and ammonia as starting materials, and a tungsten film of 50 nm thick is formed in another reactor by CVD using tungsten hexafluoride and hydrogen. Subsequently, a stacked gate layer 508 is patterned by the well-known electron beam lithography and dry etching technique.

When the titanium silicide layer is formed by the prior art method, i.e., by a heat treatment on the titanium film formed by sputtering, although the contact resistance could be reduced, it is almost impossible to prepare a titanium silicide layer as thin as that in the invention by the prior art method. Accordingly, fabricating the stacked gate layer by dry etching does not result in fine MOS transistors. So long as the thickness of the titanium silicide layer is less than 5 nm, there is scarce effect on the dry etching such that a fine MOS transistor can be manufactured by inserting a titanium silicide layer to a portion of the stacked gate layer as in the invention.

A silicon dioxide film 509 is formed on the MOS transistors 503 and 507 and planarized by CMP in the same manner as in Embodiment 1. Polycrystal silicon plugs 504 and 505 are formed by burying a polycrystalline silicon film into through holes etched in the silicon dioxide film 509 by CVD, and then removing the. polycrystalline silicon film on the silicon dioxide film 509 by a well-known etching back method. After forming the polycrystal silicon plugs 504 and 505 in the diffusion layer 520 by the etching back method, a silicon dioxide film 510 of about 0.2 $\mu$m thick is formed on the surface of the silicon substrate 500.

Subsequently, a shallow through hole 511 of 0.14 $\mu$m diameter is etched in the silicon dioxide film 510 on the polycrystal silicon plug 504 by the well-known photolithography and dry etching technique. The depth of the through hole 511 is 0.2 $\mu$m. The polycrystal silicon of the plug 504 is exposed at the bottom of the through hole 511.

Then, a deep through hole 512 of 0.14 $\mu$m diameter reaching the silicon substrate 500 is etched in the silicon dioxide films 509, 510 by using the photolithography and dry etching technique. A silicon diffusion layer 530 on the surface of the silicon substrate 500 is exposed at the bottom of the through hole 512. The depth of the through hole 512 is 0.75 $\mu$m.

Figure 12B:
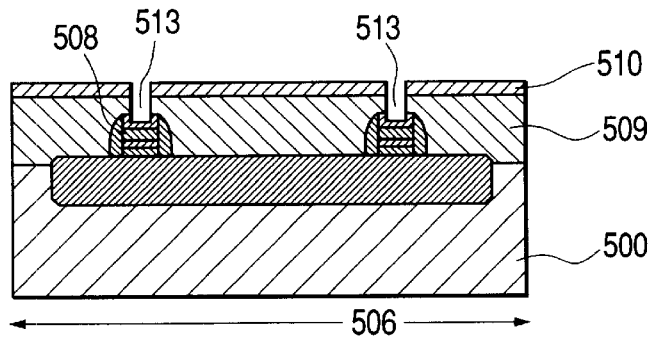

FIG. 12B shows a portion of another cross section of the silicon substrate 500. When the through hole 512 is etched, a through hole 513 for connecting the first interconnection layer with the stacked gate layer 508 is etched simultaneously in a cap layer on the gate layer comprising the silicon dioxide films 509, 510 and silicon dioxide. The diameter of the through hole 513 is 0.14 $\mu$m. The uppermost tungsten layer of the stacked gate layer 508 is exposed at the bottom of the through hole 513.

Figure 12C:
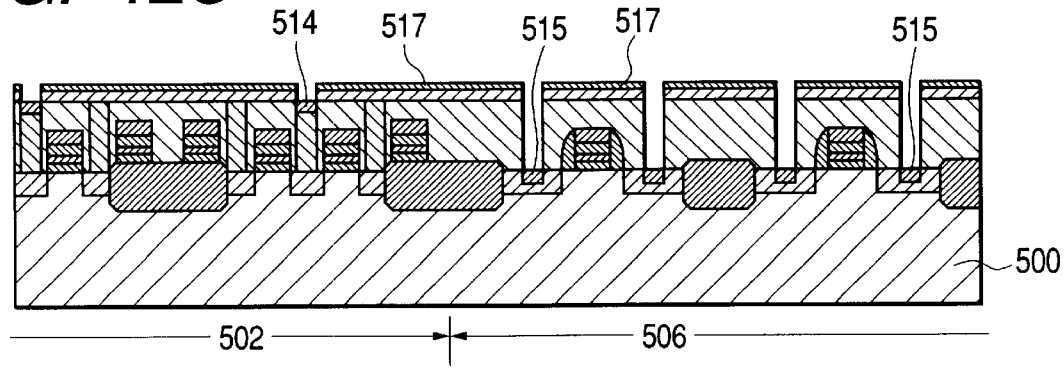
Figure 12D:
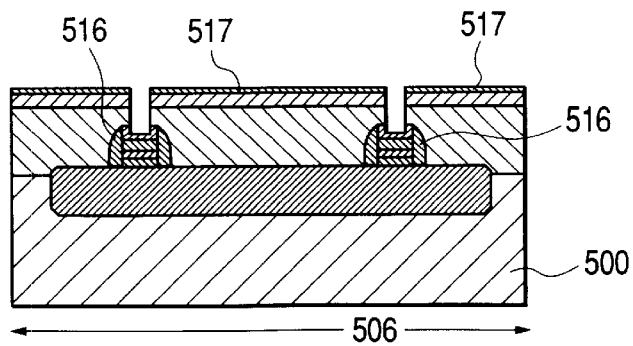

After etching the through holes 511, 512 and 513 of different depth and material exposed to the bottom, a titanium silicide layer 514 of about 5 nm thick, a titanium silicide layer 515 of about 5 nm thick, and a titanium layer 516 of about 1 nm thick are formed simultaneously by applying the manufacturing method of this invention and as shown in FIGS. 12C, 12D respectively, at the bottom of the through hole 511 etched within the memory array area 502 for connecting the first interconnection layer and the polycrystal silicon plug 503, at the bottom of the through hole 512 etched within a peripheral circuit area 506 for connecting the first interconnection layer and the diffusion layer on the surface of the silicon substrate 500, and at the bottom of the through hole 513 for connecting tungsten of the stacked gate layer (word line in the memory circuit 508. The thickness of the titanium layer 517 formed on the silicon dioxide film 510 is about 1 nm.

After nitriding the titanium layer 517 to the substrate 500 in the same manner as of the semiconductor device of Embodiment 1, rapid thermal annealing is applied on argon at 820° C. for one minute. After forming the titanium nitride film, the same subsequent processing as that for the semiconductor of Embodiment 1 is applied to the substrate 500. However, a nitrided silicon dioxide film is used as a capacitor dielectric film in this embodiment. The highest heat treatment temperature for the capacitor is 820° C.

The contact resistance between tungsten and the polycrystalline silicon layer of the stacked gate layer in the semiconductor device according to this invention with the titanium silicide layer inserted between the titanium nitride layer and the impurity-doped polycrystalline silicon layer is about 50% less than that of the semiconductor device without inserting titanium silicide layer as in the prior art.

In terms of the contact resistance of through holes of 0.14 $\mu$m diameter between the first interconnection and the silicon diffusion layer within the memory array area, there was no substantial difference between the semiconductor device according to this invention and the semiconductor device of the prior art in which the titanium silicide layer is formed by the formation of the titanium film and heat treatment.

The contact resistance of through holes of 0.14 $\mu$m diameter between the first interconnection and the silicon diffusion layer in the peripheral circuit area measured by the Kelvin method is 1.4 k$\Omega$ in average for the $p^+$ diffusion layer and 900 $\Omega$ in average for the $n^+$ diffusion layer in the semiconductor device according to this invention. On the other hand, in the semiconductor device of the prior art, the contact resistance is 2.8 k$\Omega$ in average for the $p^+$ diffusion layer and the 1.7 k$\Omega$ in average for the $n^+$ diffusion layer, which is about twice higher than the semiconductor device according to this invention. Further, for any of $n^-$ and $p^+$ through holes, the value of the standard deviation indicative of the scattering of the resistivity is about 60% smaller in the semiconductor device according to this invention.

The resistance of the through holes of 0.14 $\mu$m diameter between the first interconnection layer and the gate layer in the peripheral circuit area having tungsten surface measured one by one by the Kelvin method is 25.1 $\Omega$ in average in the semiconductor device according to this invention and 37.5 $\Omega$ in average in the semiconductor device of the prior art. The resistance is about 50% lower in the semiconductor device according to this invention. Further, the value of the standard deviation indicative of the scattering of the resistance is about 30% smaller in the semiconductor device according to this invention.

Further, the junction leakage current of diffusion layer is measured by using a pattern in which 5,000 through holes of 0.14 $\mu$m diameter were formed on the diffusion layer. The leakage current is about 20% smaller in the semiconductor device according to this invention than that in the semiconductor device of the prior art for both of $n^+$ and $p^+$ diffusion layers for the through holes between the first interconnection layer and the diffusion layer in the peripheral circuit area.

The lowered resistance according to this invention described above improves the performance of the semiconductor device, and the reduction of the leakage current lowers power consumption. That is, this invention provides a memory semiconductor device with low power consumption, high performance, and a high integration density.

In this embodiment, this invention is applied to manufacture plugs connecting the first interconnection layer with a layer comprising plural materials and plugs of different depth for connecting the first interconnection layer with the silicon layer. Regarding the difference of the depth, this invention provides the same benefits even if the depth difference of the through holes is 1.5 times or more when their diameter is of up to twice wider. Particularly, a remarkable effect is obtained when the depth different is twice or more.

The metal silicide layer formed after etching the through holes is a titanium silicide layer in this embodiment, but the similar effect can be obtained by forming the silicide layer from other metal, such as cobalt, nickel, tungsten, molybdenum, or their combination. Such a layer may be a silicide layer of plural metals, or a compound layer of plural metals and silicon, such as a mixed layer of titanium and tungsten silicides, a mixed layer of titanium and cobalt silicides, or compound layers comprising titanium, tungsten and silicon, or a compound layer of plural metals and silicon by CVD.

Further, while the nitrided silicon dioxide film is used as the main capacitor dielectric film in this embodiment, a similar effect can be obtained by using a dielectric film, such as a tantalum oxide film, tantalum oxide film with addition of impurities (such as silicon or titanium) or a barium strontium titanate film, since heat treatment at a temperature of 600° C. or higher is generally required after forming the through holes. Further, when this invention provides a ferroelectric memory using a ferroelectric film such as PZT (lead zirconate titanate), the same effect as in this embodiment can be obtained.

<Embodiment 3>

The third embodiment of this invention for manufacturing a logic semiconductor device uses a complementary MOS (CMOS) shown in FIGS. 13–17. Specifically, this invention is applied to local interconnection having a shape of etched area on the surface of a dielectric film of a rectangular shape or a portion of the film shaped as the rectangular.

Figure 13:
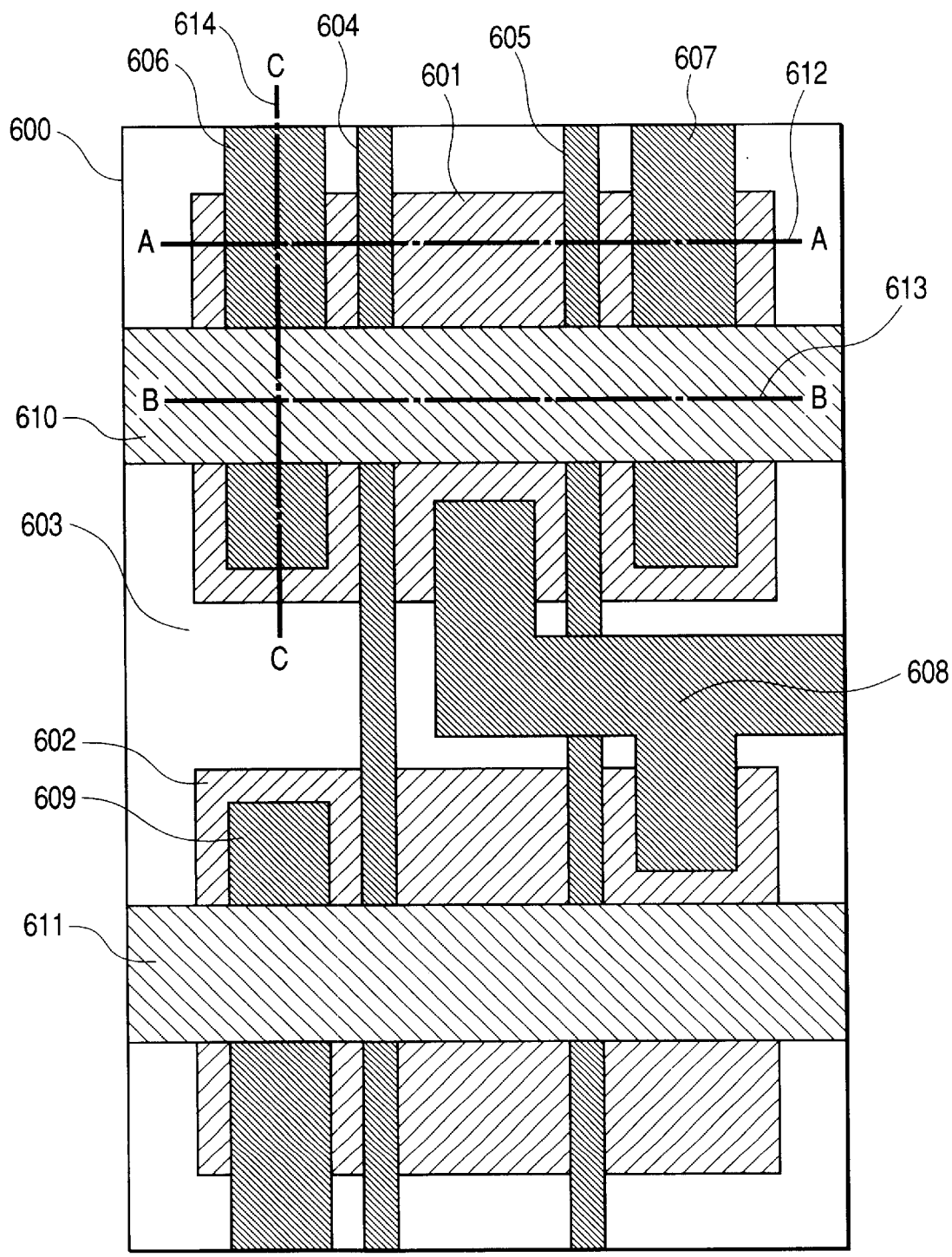
FIG. 13 is a top view of a third embodiment according to this invention.

FIG. 13 is a layout of a logic semiconductor device according to this invention. Only the layers required for explanation of this embodiment are shown in FIG. 13. A frame 600 denotes a boundary indicative of a range for a portion of the layout described in FIG. 13. Active areas 601 and 602 are isolated by a shallow trench device isolation region 603. The width for each of gate layers 604 and 605 is 0.13 $\mu$m.

Local interconnection layers 606, 607, 608 and 609 connect active areas rather than the insulation areas to each other (only one active area is illustrated for the local interconnection layers 606, 607 and 609), and first interconnection layers 610 and 611 extend perpendicularly to the gate layers 604 and 605. Each of the local interconnection layers 606, 607 and 609 has a rectangular etched area with a pair of longer sides twice or more longer than the pair of short sides and the local interconnection layer 608 has a portion shaped as the rectangle as described above. The local interconnection layers 606, 607, 608 and 609 are partially present on the silicon dioxide film in the shallow trench device isolation area. The through hole layer for connecting the diffusion layer and the first interconnection layer (not illustrated) and the local interconnection layers 606, 607, 608 and 609 are located on the same horizontal level.

Figure 14A:
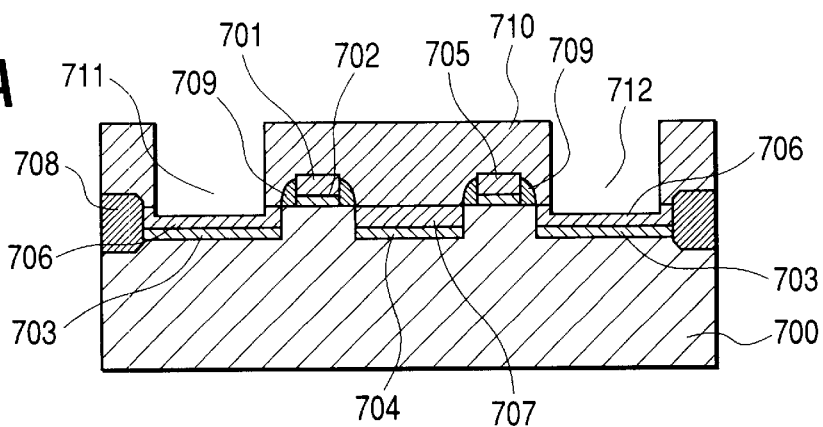
FIGS. 14A–14D are a first set of sequential charts explaining the third embodiment.

FIG. 14A shows a cross section of a silicon substrate 700 at the intermediate manufacturing stage of a logic semiconductor device of this embodiment. A pattern based on the layout in FIG. 13 is arranged. FIG. 14A corresponds to a cross section taken along the A—A line 612 shown in FIG. 13.

A portion of a stacked gate layer of an MOS transistor 701 is formed of a polycrystalline silicon layer 702. After forming diffusion layers 703 and 704 at a depth of about 30 nm from the surface of the substrate 700 for the n$^+$ layer and at the depth of about 35 nm from the surface of the substrate 800 for the p$^+$ layer by the well-known ion implantation technique or the like, cobalt silicide layers 705, 706 and 707 are formed selectively on the entire surface of the polycrystalline silicon layer 702 and the diffusion layers 703 and 704. The cobalt silicide layers 705, 706 and 707 are formed by the following steps.

A cobalt film of about 7 nm thick is formed by sputtering, and the cobalt silicide layers 705, 706 and 707 are formed by rapid thermal annealing nitrogen at 600° C. for one minute selectively onto the polycrystalline silicon layer 702 and the diffusion layer areas 703 and 704 in which the silicon substrate is exposed. After removing an unreacted cobalt film and a reaction product layer of cobalt and silicon dioxide on the silicon dioxide film in the shallow trench device isolation area 708 and on the side wall 709 by wet etching with a mixed solution of sulfuric acid/hydrogen peroxide, then rapid thermal annealing argon at 800° C. for one min. The thickness for each of the cobalt silicide layers 705, 706 and 707 is about 15 nm.

Then, in the same manner as in Embodiment 1, an interlayer dielectric film 710 is formed so as to cover the MOS transistor 701, and the surface is planarized by CMP. The thickness from the surface of the diffusion layer is about 0.4 μm after CMP.

Subsequently, local interconnection holes 711 and 712 for connecting active areas to each other are etched. The local interconnection hole 711 corresponds to the local interconnection layer 606, and the local interconnection hole 712 corresponds to the local interconnection layer 607, in the layout of FIG. 13, respectively. The thickness of the cobalt suicide layer 706 at the bottom of the local interconnection holes 711, 712 is reduced to about 10 nm by excessive etching.

Figure 14B:
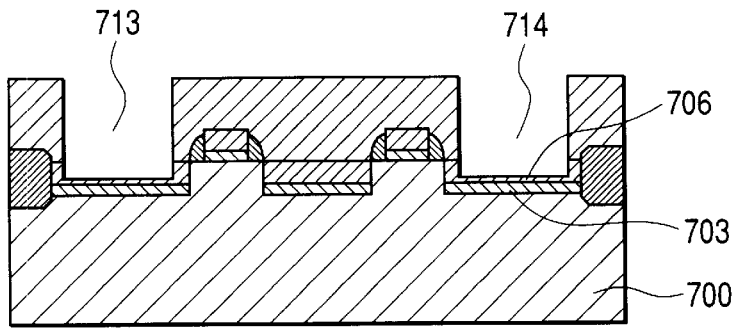

Then, a cross section taken along the B—B line 612 in FIG. 13 is shown in FIG. 14B. A local interconnection hole 713 corresponds to the local interconnection layer 606, and a local interconnection hole 714 corresponds to the local interconnection layer 607 in the layout of FIG. 13. The thickness of the cobalt silicide layer 706 on the diffusion layer 703 at the bottom of the local interconnection holes 713 and 714 is reduced to about 3 nm by excessive dry etching.

Figure 14C:
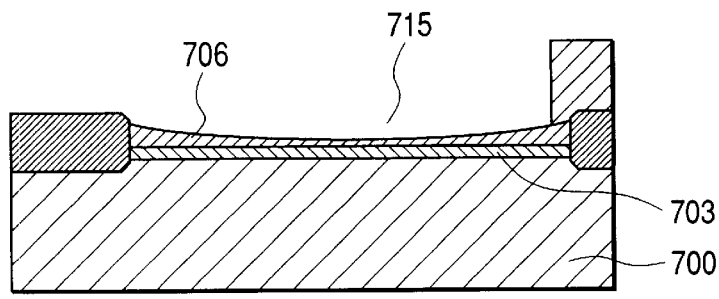

FIG. 14C shows a cross section taken along the C—C line 614 in FIG. 13. A local interconnection 715 corresponds to the local interconnection layer 606 in the layout of FIG. 13. The thickness of the cobalt silicide layer 706 formed on the diffusion layer 703 at the bottom of the local interconnection 715 is reduced about 2 nm to about 11 nm by excessive dry etching.

Figure 14D:
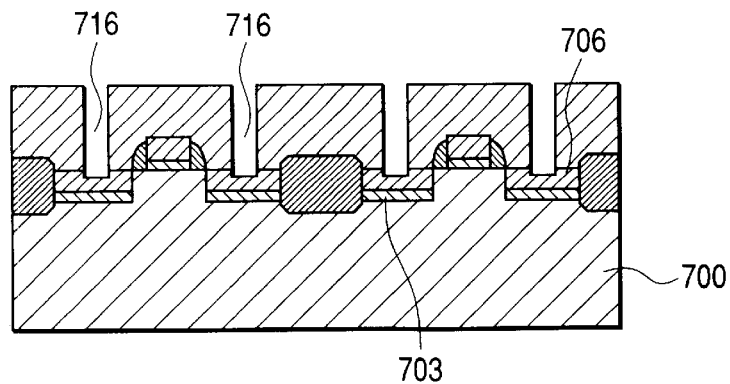

FIG. 14D shows another cross section which corresponding portion is not shown in the layout of FIG. 13. A through hole 716 has a circular etched area with a 0.13-μm diameter, and the thickness of the cobalt silicide layer 706 on the diffusion layer 703 at the bottom of the through hole 716 is reduced to about 15 nm by excessive dry etching. The through holes 716 are etched simultaneously with the local interconnection holes 711, 712 having a rectangular etched area shown in FIGS. 14A, 14B and 14C.

Further, local interconnections corresponding to the local interconnection layer 608 shown in the layout of FIG. 13 are etched simultaneously (not illustrated). The cobalt silicide layer and the silicon dioxide in the shallow trench device isolation region are also exposed in the lower portion of the local interconnections.

When etching is applied to the silicon substrate 700 for etching fine through holes 716 shown in FIG. 14D, local interconnections 711 and 712 having a rectangular sectional shape and the local interconnection having a portion having a sectional shape of the rectangular are etched excessively as shown in FIG. 14C. The silicide layer 706 is scraped by excessive etching, particularly, at the longitudinal central portion of the rectangle.

In this embodiment, a group of openings (through holes or local interconnection holes) of different etched area shapes described above are etched simultaneously in one single CVD process. Since the optimal condition for the dry etching depends on the shape of the etched area, etching at a higher accuracy is possible by etching the through hole or the local interconnection of the rectangular etched area with separate steps. The etching of the cobalt silicide layer 706 at the bottom of the holes can be adjusted also by such a technique, but this results in a drawback of complicated steps. Further, if the lithographic step is also conducted separately for holes of different shape, it requires further ensuring alignment margins between the layers at the bottom of the through holes or between the layers at the bottom of the local interconnection holes (both are inherently in an identical layer), this causes problems for miniaturization.

The silicon substrate 700, at the intermediate manufacturing stage of the logic semiconductor device, is placed on a specimen table in a pressure-reduced reactor of a plasma CVD apparatus like that in Embodiment 1. The silicon substrate 700 is heated to 580° C. by a heating mechanism incorporated in the specimen table. After introducing 5 sccm of titanium tetrachloride, 0.5 sccm of molybdenum pentachloride, and 400 sccm of hydrogen, a radio frequency power of 500 W at 350 kHz is applied to generate plasmas. Since molybdenum pentachloride is solid at a normal temperature, it is introduced after sublimation by heating the vessel.

Figure 15A:
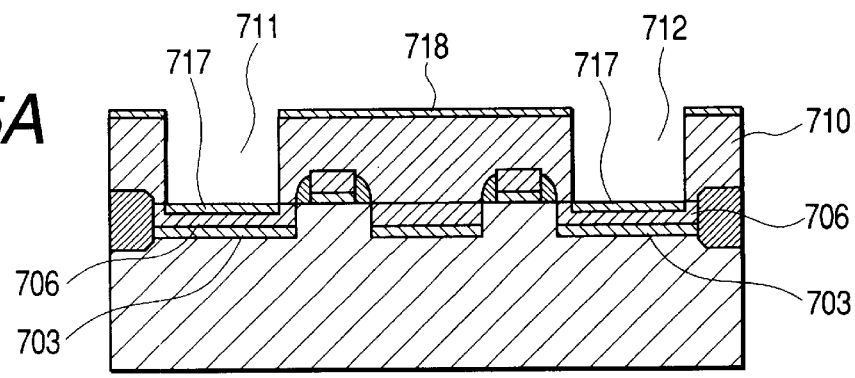
FIGS. 15A–15D are a second set of sequential charts explaining the third embodiment.

FIG. 15A is a cross sectional view of the structure corresponding to FIG. 14A. By electric discharge for 40 seconds, a layer 717 comprising molybdenum-containing titanium silicide as a major constituent element of about 4 nm thick is further formed on the cobalt silicide layer 706 on the surface of the diffusion layer 703. A portion of the layer 717 comprising titanium silicide as the major constituent element is mixed with the lower cobalt silicide layer 706. The thickness of the titanium film 718 containing molybdenum formed on the silicon dioxide film 710 between the local interconnection holes 711 and 712 of rectangular planar or sectional shape is less than 2 nm.

Figure 15B:
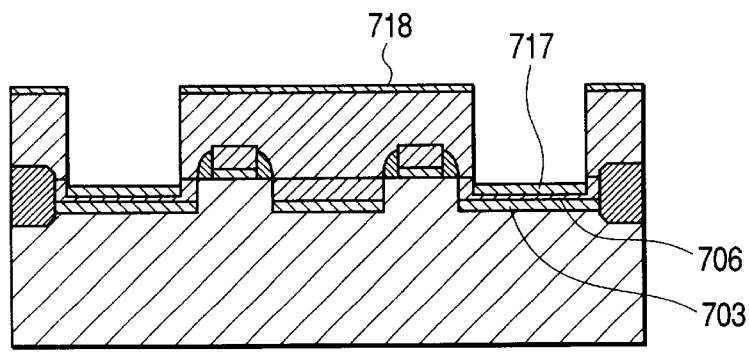

FIG. 15B is a cross sectional view of the structure corresponding to FIG. 14B. A layer 717 comprising molybdenum-containing titanium silicide as the major constituent element of about 6 nm thick is further formed on the cobalt silicide layer 706 on the surface of the diffusion layer 703. The thickness of the molybdenum-containing titanium film 718 formed on the silicon dioxide film 710 is less than 2 nm.

Figure 15C:
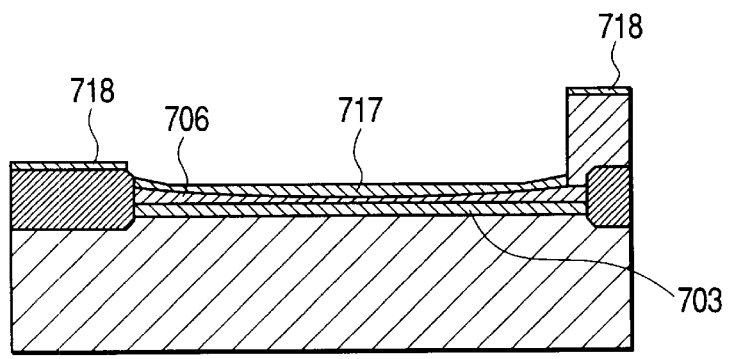

FIG. 15C is a cross sectional view of the structure corresponding to FIG. 14C. A layer 717 (with molybdenum) containing titanium silicide as the major constituent element of about 3–6 nm thick is further formed on the cobalt silicide layer 706 on the surface of the diffusion layer 703. The thin layer 717 (with molybdenum) containing titanium silicide as the major constituent element is formed to a thick portion of the cobalt silicide layer 706. The thickness of a molybdenum-containing titanium film 718 formed on the silicon dioxide film 710 or on the shallow trench device isolation 708 comprising silicon dioxide is less than 2 nm.

Figure 15D:
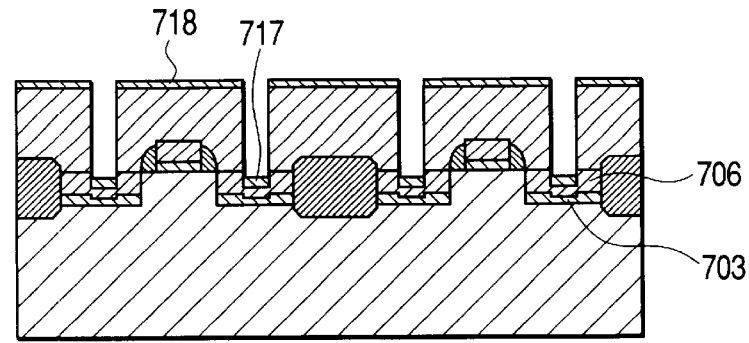
Figure 16A:
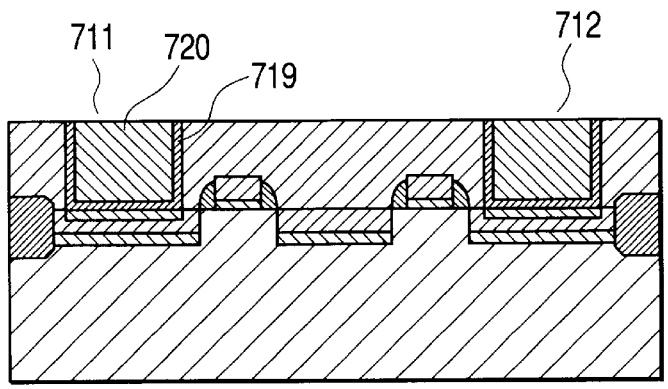
FIGS. 16A–16D are a third set of sequential charts explaining the third embodiment.
Figure 16B:
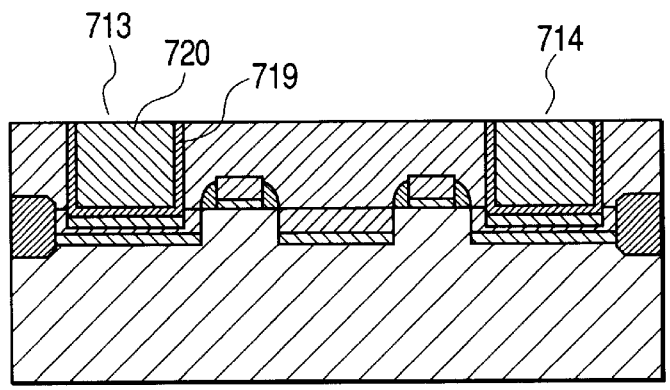
Figure 16C:
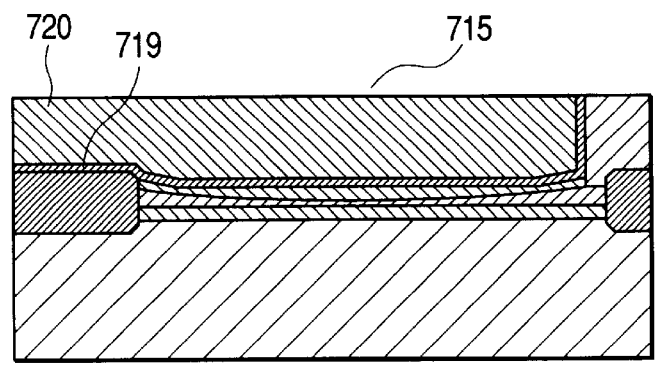
Figure 16D:
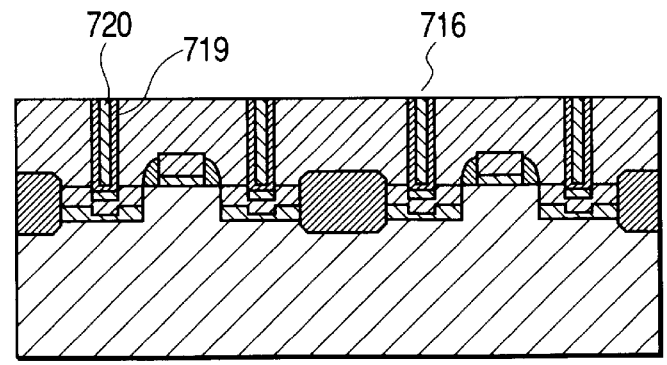

FIG. 15D is a cross sectional view of the structure corresponding to FIG. 14D. A layer 717 comprising molybdenum-containing titanium silicide as the major constituent element of about 2 nm thick is further formed on the cobalt silicide layer 706 on the surface of the diffusion layer 703. The thickness of the molybdenum-containing titanium film 718 formed on the silicon dioxide film 710 is less than 2 nm.

For the substrate 700, in which each of the layers 717 is formed simultaneously, the same treatment as in Embodiment 1 is applied. A titanium nitride film of 20 nm thick is formed by CVD with titanium tetrachloride and ammonia as starting materials. A tungsten film of 60 nm thick is then formed by CVD with tungsten hexafluoride and hydrogen. By the formation of the titanium nitride film and the tungsten film, the local interconnection 606 is formed inside local interconnection holes 711, 713 and 715 and, the local interconnection 607 is formed in the local interconnection, and holes 712, 714 and plugs (not illustrated) are formed inside the through holes 716.

After forming the titanium nitride film and the tungsten film, when the films on the silicon dioxide film 710 other than the titanium nitride film 719 and the tungsten film 720 formed inside the local interconnection holes 711, 712, 713, 714 and 715 and the through holes 716 are once removed by CMP, the structure as shown in FIGS. 16A, 16B, 16C and 16D are formed. FIGS. 16A, 16B, 16C and 16D are cross sections of the holes corresponding to FIGS. 15A, 15B, 15C and 15D, respectively. Upon removing of the films by CMP, the molybdenum-containing titanium film 718 formed on the silicon dioxide 710 is also removed.

Figure 17A:
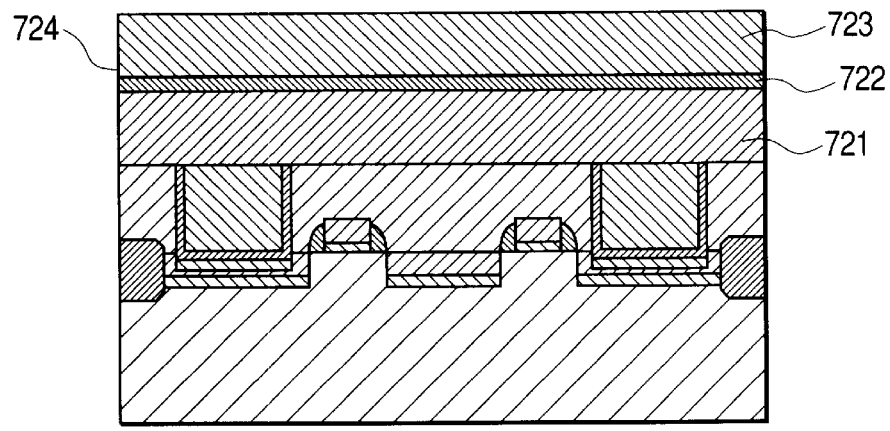
FIGS. 17A–17C are a forth set of sequential charts explaining the third embodiment.
Figure 17B:
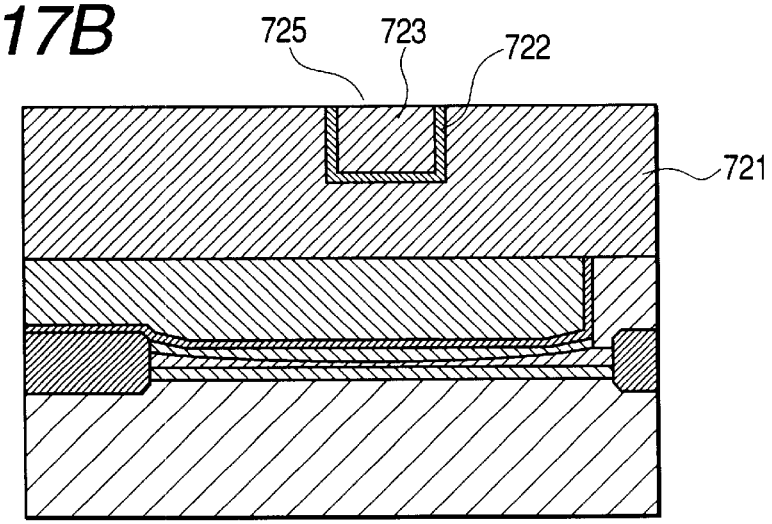
Figure 17C:
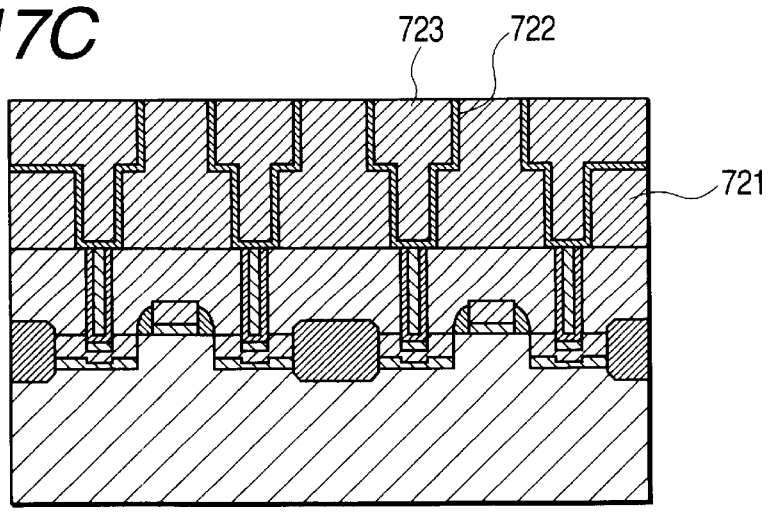

Then, after forming a silicon dioxide film 721 again on the main surface of the substrate 700 and fabricating trenches for the first interconnection layer and through holes for connecting the first interconnection layer with the diffusion layer, a tantalum oxide film 722 and a copper film 723 are formed by CVD and, successively, films on the silicon dioxide film 723 other than the tantalum nitride film 722 and the copper film 723 inside the trenches and the holes by CMP as shown in FIGS. 17A, 17B and 17C are formed. FIGS. 17A, 17B, 17C are cross sectional views of the structures corresponding to FIGS. 16A, 16B, 16C and 16D, respectively. Both of the first interconnection layers 724 and 725 are interconnections corresponding to the first interconnection layer 610 of FIG. 13. Further, subsequent processing is applied to the substrate 700 up to the formation of the fifth interconnection layer from the uppermost layer.

In the semiconductor device in this embodiment according to this invention, the contact resistance between the first interconnection layer and the diffusion layer or the gate layer and the contact resistance between the diffusion layers by the local interconnection are lower by about 20% compared with the semiconductor device of the prior art. The junction leakage current of the diffusion layer below the local interconnection is about two digits smaller than that in the prior art. In the prior art, the silicide layer is formed after etching by using film deposition by the same sputtering as explained for Embodiments 1 and 2. The target used in sputtering is a titanium target containing 10% molybdenum.

The reduced resistance according to this invention described above improves the performance of the semiconductor device and the reduction of the leakage current lowers power consumption. That is, this invention provides a memory semiconductor device with low power consumption, high performance and a high integration density.

In this embodiment, the cobalt silicide layer is formed on the surface of the diffusion layer, but the effect of this invention can be obtained in the same manner as in the case of using a silicide layer of other metal, such as titanium, nickel, tungsten or molybdenum. The effect of this invention can be obtained not only to the silicide layer of single metal but a silicide layer of plural metals, or a compound layer of plural metals and silicon, such as a mixed layer of titanium and cobalt silicides, a mixed layer of cobalt and nickel silicides, a mixed layer of titanium and nickel suicides, a mixed layer of titanium and tantalum, a compound layer comprising titanium, cobalt and silicon, or a compound layer of titanium, tantalum and silicon.

The metal silicide layer formed after etching the through holes is a layer (with a molybdenum silicide) containing titanium silicide as a major constituent element in this embodiment. However, the similar effect can also be obtained by forming a silicide layer of other metal, such as cobalt, nickel, tungsten, molybdenum, or their combination, including a silicide layer of plural metals or a compound layer of plural metals and silicon, such as a mixed layer of titanium and tungsten silicides, a mixed layer of cobalt and nickel silicides, or a mixed layer of titanium and cobalt silicides, or a compounds layer of titanium, tungsten and silicon by CVD.

<Embodiment 4>

FIG. 18 shows the fourth embodiment of this invention for manufacturing a logic semiconductor device using CMOS. Specifically, this invention is applied to manufacture plural through holes having etched areas in the dielectric film of different cross sectional shapes.

Figure 18A:
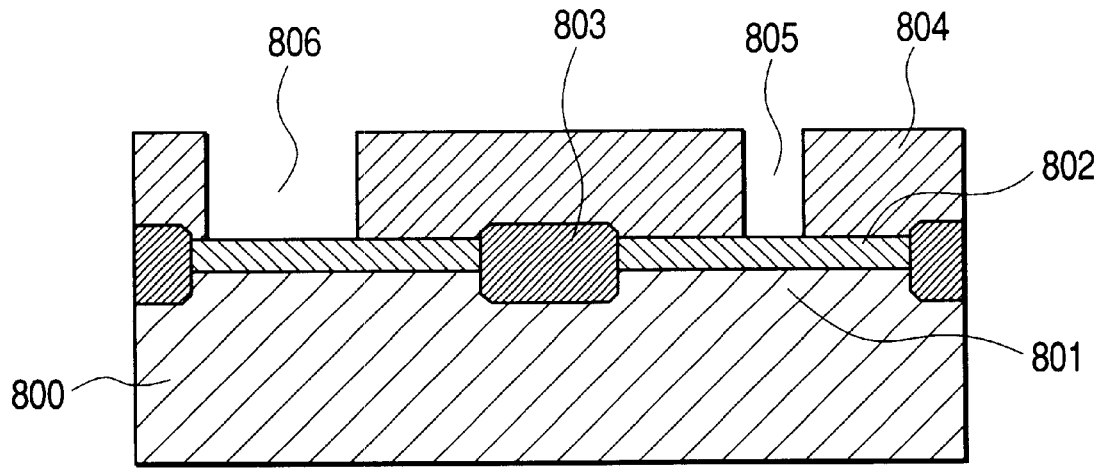
FIGS. 18A and 18B are a fifth set of sequential charts explaining the third embodiment.

FIG. 18A shows a cross section of a silicon substrate 800 at the intermediate manufacturing stage of a logic semiconductor device of this invention. After forming a diffusion layer 801 at a depth of about 30 nm from the surface of the substrate 800 both for $n^+$ and $p^-$ layers by using a well-known ion implantation technique or the like, a cobalt silicide layer 802 is formed selectively over the surface of the diffusion layer 801. The cobalt silicide layer 802 is formed in the same manner as in Embodiment 3. The thickness of the cobalt silicide layer 802 is about 7 nm. The cobalt silicide layer is not formed on a shallow trench device isolation area 803.

Then, an interlayer dielectric film 804 is formed to cover an MOS transistor (not illustrated) by the same method as in Embodiment 1, and the surface is planarized by CMP. The thickness from the surface of the diffusion layer is about 0.4 $\mu$m after CMP. Then, through holes 805 and 806 for connecting the diffusion layer with a first interconnection layer are etched by using the well-known electron beam lithography and dry etching technique. The through hole 805 has a diameter of about 0.13 $\mu$m, and the through hole 806 has a diameter of about 0.35 $\mu$m. The difference of the aspect ratio (depth to diameter ratio) between the through holes is 2.7 times.

The silicon substrate 800 at the intermediate manufacturing stage of the logic semiconductor device is placed on a specimen table in a pressure-reduced reactor of a plasma CVD apparatus like that in Embodiment 1. The silicon substrate 800 is heated to 580° C. by a heating mechanism incorporated in the specimen table. After introducing 5 sccm of titanium tetrachloride and 400 sccm of hydrogen, a radio frequency power of 700 W at 450 kHz is applied to generate plasmas.

Figure 18B:
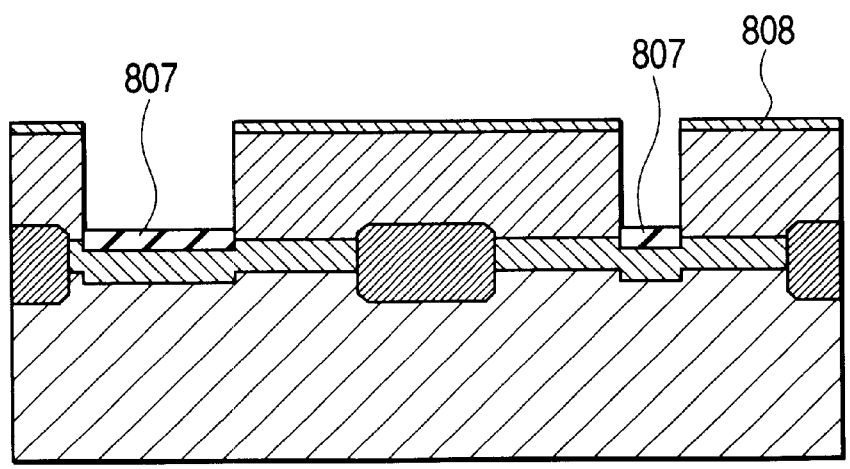

As shown in FIG. 18B, a layer 807 comprising a titanium silicide as a major constituent element of about 10 nm thick is further formed on a cobalt silicide layer 802 on the surface of a diffusion layer 801 by electric discharge for 40 seconds. The layer 807 comprising titanium silicide as the major constituent element contained cobalt, and a portion of the layer 807 comprising titanium silicide as the major constituent element are respectively mixed with lower cobalt suicide layer 802 at the under layer. The thickness of the titanium film 808 formed on the silicon dioxide film 804 which is formed on the surface and between the local interconnection holes 805 and 806 is less than 2 nm.

The same processing as in Embodiment 1 is applied to the substrate 800 in which the layer 807 is formed at the bottom of the through holes 805 and 806 of different aspect ratio simultaneously, a titanium nitride film of 50 nm thick is formed by CVD using titanium tetrachloride and ammonia as starting materials and, further, a tungsten film of 150 nm thick is formed by CVD using tungsten hexafluoride and hydrogen as starting materials. Subsequently, the interconnection layer is formed in the same manner as in Embodiment 3.

Figure 19A:
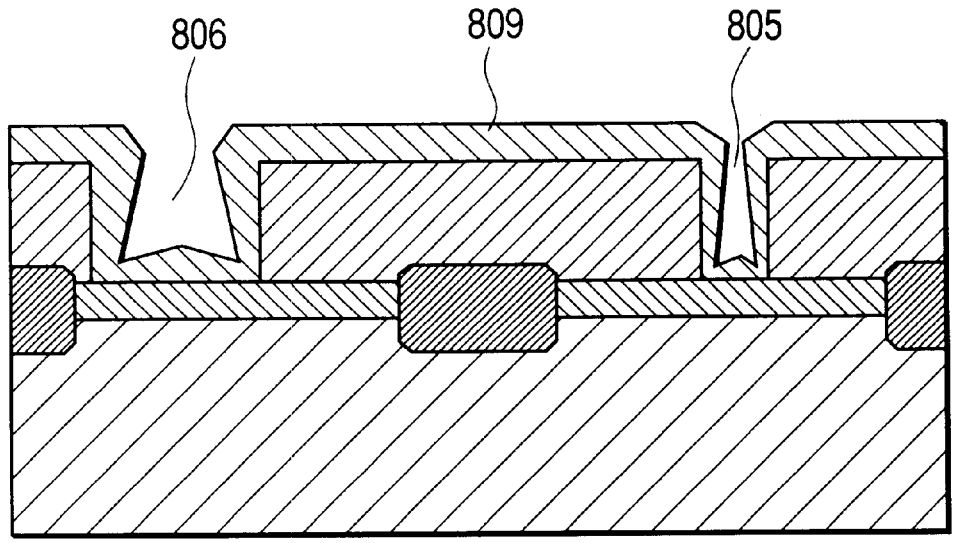
FIGS. 19A–19B is a cross-sectional view of a comparative embodiment of the prior art with respect to the third embodiment of the invention shown in FIG. 19A.

A logic semiconductor device by the prior art is also described for comparison. When a silicon substrate 800 at the intermediate manufacturing stage of a logic semiconductor device shown in FIG. 18A is placed on a specimen table of a sputtering apparatus, and a titanium film 809 of 50 nm thick on the planarized silicon dioxide film 804 is formed on the entire surface so as to form a structure as shown in FIG. 19A.

The titanium film 809 formed by sputtering has an inherent coverage shape (overhang shape) due to the shadowing effect of the surrounding silicon dioxide film 804 inside the through holes 805 and 806 (thicker in the central portion and thinner in the periphery at the bottom of the through holes 805 and 806). The thickness of the titanium film 809 at the central portion is about 3 nm in the through hole 805 and about 5 nm in the through hole 806.

Figure 19B:
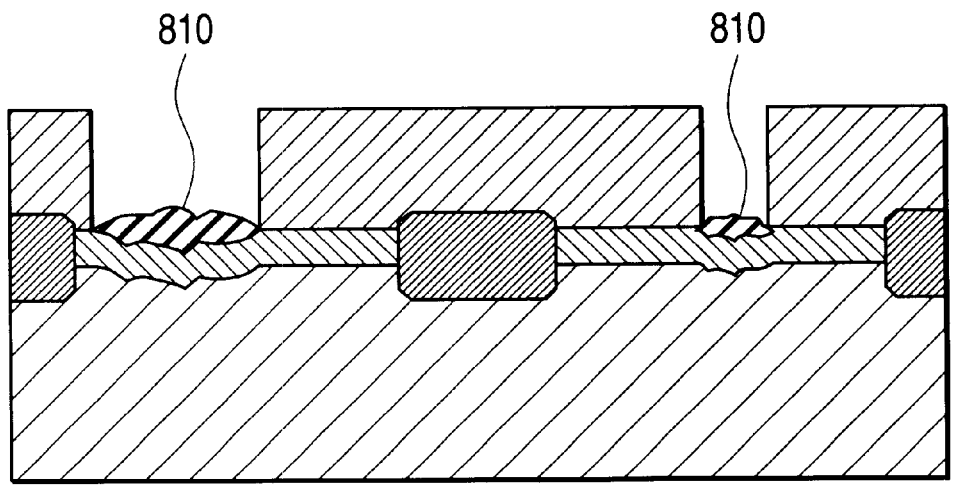

Subsequently, the titanium film in contact with the cobalt silicide layer 802 reacts with silicon by rapid thermal annealing argon at 700° C. for one minute to form a titanium silicide layer 810. When an unreacted titanium film and a reaction product layer of titanium and silicon dioxide on the silicon dioxide film 804 are removed by wet etching with a hydrogen peroxide/ammonia mixed solution, a structure as shown in FIG. 19B is formed.

The embodiment of the invention is different from the prior art in that it substitutes the sputtering processing with a CVD processing before forming the titanium nitride film. In other words, the same processing as in the previous embodiment of this invention is applied after forming the titanium nitride film.

In the semiconductor device according to this embodiment of the invention, the contact resistance of the through hole of 0.13 μm diameter between the first interconnection layer and the diffusion layer is reduced by about 20% compared with that of the semiconductor device of the prior art. The junction leakage current of the diffusion layer in a test pattern where 10,000 densely arranged through holes of 0.3 μm diameter are about two digits smaller than that of the prior art.

In the prior art method, the contact resistance is high and the junction leakage current is large because it is impossible by the prior art method to form a titanium silicide layer within an appropriate thickness range for through holes of aspect ratios different by two or more. Since titanium silicide layer of a sufficient thickness is not formed at the bottom of the holes with a large aspect ratio, the contact resistance increases therein. On the other hand, since a titanium silicide layer of an excessive thickness than necessary is formed at the bottom of a hole with a small aspect ratio, it results in a portion where the cobalt silicide layer breaks through the junction, which increases the junction leakage current.

The reduced resistance according to this invention described above improves the higher performance of the semiconductor device, and the reduction of the leakage current lowers power consumption. That is, this invention provides a memory semiconductor device with low power consumption, high performance and a high integration density.

In this embodiment, the cobalt silicide layer is formed on the surface of the diffusion layer, but the effect of this invention can be obtained by using a silicide layer of other metal, such as titanium, nickel, tungsten, or molybdenum. The effect of this invention can be obtained not only via the silicide layer of single metal but also via a silicide layer of plural metals, or a compound layer of plural metals and silicon, such as a mixed layer of titanium and cobalt suicides, a mixed layer of cobalt and nickel silicides, a mixed layer of titanium and nickel silicide, a titanium and tantalum silicide layer, or a compound layer comprising titanium, cobalt and silicon, or a compound layer comprising titanium, tantalum and silicon.

The metal silicide layer formed after etching the through holes is a layer comprising titanium silicide as the major constituent element in this embodiment However, the similar effect can also be obtained by forming a silicide layer of other metals, such as cobalt, nickel, tungsten, molybdenum, or a silicide layer of plural metals or compound layers of plural metals and silicon, such as a mixed layer of titanium and tungsten silicides, a mixed layer of cobalt and nickel silicides, a mixed layer of titanium and cobalt silicides, or a compound layer of titanium, tungsten and silicon by CVD.

The invention provides a manufacturing method for attaining low contact resistance for connection between plugs or local interconnections and underlayers thereof, and for attaining a sufficiently lower junction leakage current of a diffusion layer in a case where the underlayer is a diffusion layer, thereby providing a semiconductor device of a high integration density and high performance. Particularly, it maintains a sufficiently low junction leakage current from the diffusion layer and low contact resistance even by using a heat treatment step at high temperature after forming the diffusion layer or the plug, thereby enabling a highly integrated memory semiconductor device or a high performance memory logic embedded LSI with fine plugs. Further, it incurs a sufficiently small junction leakage current of the diffusion layer and low contact resistance even if the plugs or local interconnections formed with through holes of different depths, through holes or interconnection holes of different shapes and sizes, thereby providing a high performance logic semiconductor device with fine plugs or local interconnections, and a high performance memory-logic embedded LSI.

The foregoing invention has been described in terms of preferred embodiments. However, those skilled in the art will recognize that many variations of such embodiments exist. Such variations are intended to be within the scope of the present invention and the appended claims.

What is claimed is:

1. A method for manufacturing a semiconductor device, comprising:

forming a dielectric film on a substrate;

etching the dielectric film to form at least two of three groups of openings such that on a bottom surface of each of the first group of openings having silicon as a major constituent element, on a bottom surface of each of the second group of openings having a first metal silicide as a major constituent element, and on a bottom surface of each of the third group of openings having a first metal as a major constituent element; and forming, depending on at least two of three groups of openings formed by said etching step, at least two of three layers such that a layer having a second metal silicide as a major constituent element on the bottom of each of the first group of openings, a layer having the second metal silicide as a major constituent element on the bottom of each of the second group of openings, and a layer having a second metal as a major constituent element on the bottom of each of the third group of openings, simultaneously, by one single chemical vapor deposition process.

2. The method for manufacturing a semiconductor device as defined in claim 1, wherein a layer having at least one said bottom surface of each of the first group of openings constitutes a diffusion layer formed on the silicon substrate.

3. The method for manufacturing a semiconductor device as defined in claim 1, wherein a layer having at least one said bottom surface of each of the first group of openings constitutes a silicon layer which is at least partially in contact with a diffusion layer on the silicon substrate.

4. The method for manufacturing a semiconductor device as defined in claim 2, wherein a layer having at least one said bottom surface of each of the first group of openings or a layer having said bottom surface of each of the second group of openings constitutes a source or a drain of an MOS transistor.

5. The method for manufacturing a semiconductor device as defined in claim 3, wherein a layer having at least one said bottom surface of each of the first group of openings or a layer having said bottom surface of each of the second group of openings constitutes a source or a drain of an MOS transistor.

6. The method for manufacturing a semiconductor device as defined in claim 1, wherein a layer having at least one said bottom surface of each of the second group of openings constitutes a gate of an MOS transistor.

7. The method for manufacturing a semiconductor device as defined in claim 6, wherein a layer having at least one said bottom surface of each of the second group of openings constitutes a word line of a DRAM.

8. The method for manufacturing a semiconductor device as defined in claim 1, wherein a layer having at least one said bottom surface of each of the third group of openings constitutes a gate of an MOS transistor.

9. The method for manufacturing a semiconductor device as defined in claim 8, wherein a layer having at least one said bottom surface of each of the third group of openings constitutes a word line of a DRAM.

10. The method for manufacturing a semiconductor device as defined in claim 1, wherein a layer having at least one said bottom surface of each of the second group of openings includes titanium silicide, cobalt silicide, nickel silicide, tungsten silicide or molybdenum silicide as the major constituent element.

11. The method for manufacturing a semiconductor device as defined in claim 1, wherein a layer having at least one said bottom surface of each of the third group of openings includes tungsten as the major constituent element.

12. The method for manufacturing a semiconductor device as defined in claim 1, wherein at least one said layer having the second metal silicide as a major constituent element includes titanium silicide as the major constituent element.

13. The method for manufacturing a semiconductor device as defined in claim 1, wherein at least one said layer having the second metal as a major constituent element includes titanium as the major constituent element.

14. The method for manufacturing a semiconductor device as defined in claim 1, wherein at least one of starting materials for the forming at least two of three layers said chemical vapor deposition process is titanium tetrachloride.

15. The method for manufacturing a semiconductor device as defined in claim 1, further comprising a step of heating the substrate at a temperature of 600° C. or higher after the forming at least two of three layers by said chemical vapor deposition process.

16. The method for manufacturing a semiconductor device as defined in claim 1, further comprising a step of forming a layer having a metal nitride as a major constituent element on said layer having the second metal silicide as a major constituent element by chemical vapor deposition process.

17. The method for manufacturing a semiconductor device as defined in claim 16, wherein said metal nitride is titanium nitride.

18. The method for manufacturing a semiconductor device as defined in claim 17, further comprising a step of heating the substrate at a temperature of 600° C. or higher after the forming said layer having the metal nitride as a major constituent element.

19. The method for manufacturing a semiconductor device as defined in claim 16, further comprising a step of forming at least one capacitor for a memory circuit on the substrate after forming said layer having the metal nitride as a major constituent element.

20. The method for manufacturing a semiconductor device as defined in claim 19, wherein a capacitor dielectric film constituting said capacitor is a film having tantalum oxide as a major constituent element.

* * * * *